United States Patent
Matsuda et al.

(10) Patent No.: US 6,800,871 B2
(45) Date of Patent: Oct. 5, 2004

(54) DISPLAY DEVICE AND PROCESS OF PRODUCING THE SAME

(75) Inventors: Hiroshi Matsuda, Kanagawa (JP); Takao Yonehara, Kanagawa (JP); Etsuro Kishi, Kanagawa (JP); Tsutomu Ikeda, Tokyo (JP); Kiyofumi Sakaguchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/327,147

(22) Filed: Dec. 24, 2002

(65) Prior Publication Data

US 2003/0179191 A1 Sep. 25, 2003

(30) Foreign Application Priority Data

Dec. 27, 2001 (JP) ........................................ 2001-396723
Dec. 17, 2002 (JP) ........................................ 2002-385031

(51) Int. Cl.[7] ............................................. H01L 39/00
(52) U.S. Cl. ............................. 257/30; 257/80; 257/72
(58) Field of Search ..................... 257/30, 72; 438/458, 438/34, 29

(56) References Cited

U.S. PATENT DOCUMENTS

| 6,005,284 A | 12/1999 | Ejiri et al. .................. 257/588 |
| 2001/0041423 A1 | 11/2001 | Nishida et al. ............. 438/455 |
| 2002/0100941 A1 | 8/2002 | Yonehara et al. ........... 257/359 |
| 2002/0102758 A1 | 8/2002 | Yonehara et al. ............. 438/30 |
| 2002/0102777 A1 | 8/2002 | Sakaguchi et al. .......... 438/149 |

FOREIGN PATENT DOCUMENTS

| JP | 5-218365 | 8/1993 |
| JP | 5-283722 | 10/1993 |

OTHER PUBLICATIONS

T.N. Jackson, et al., "Organic Thin Film Transistors for Flexible–Substrate Displays," Conference Record of the 20th International Display Research Conference, pp. 411–414 (Sep. 25–28, 2000).
D.J. Gundlach, et al., "High–Mobility, Low Voltage Organic Thin Film Transistors", IEEE, pp. 111–114 (1999).

*Primary Examiner*—Roy Potter
(74) *Attorney, Agent, or Firm*—Fitzpatrick, Cella, Harper & Scinto

(57) ABSTRACT

The present invention relates to a configuration of a display element and forms switching circuits or peripheral circuits for driving pixels by transferring/disposing a semiconductor circuit formed on another substrate and disposes high performance transistors on the display substrate. The present invention also relates to a process of forming a circuit having switching elements for driving pixels and peripheral circuits for sending drive signals thereto on the substrate of the display element. A separation layer is formed on a second substrate and a semiconductor film is formed thereon. This semiconductor film having predetermined semiconductor circuits formed therein is bonded to the substrate of the display element and then electrical connection with a wire on the substrate is effected.

36 Claims, 13 Drawing Sheets

DISPLAY DEVICE AND PROCESS OF PRODUCING THE SAME

BACKGROUND OF THE INVENTION

1. Field of the Invention

The present invention relates to a display element and a display device and a process of producing a display-related circuit in particular, and more particularly, to a display element and apparatus characterized by being formed by transferring separately-prepared thin-film-shaped circuits to and arranging them on a substrate carrying a pixel section of the display device and a process of producing the same.

2. Related Background Art

In recent years, many suggestions have been made about a display medium which is close to paper (printed matter) in form or a display medium the display content of which is electrically rewritable, under the name of digital paper, paper-like display, electronic book, or the like. More specifically, an electronic book comprised of a plurality of sheet-like page displays or the like is under study.

In such a conventional sheet-like display, wiring between a display element and control circuit is performed using an enormous number of external wires.

However, the above-described sheet-like page display is required to be as thin as possible to incorporate various electrical control circuits thereinto. This makes it necessary to mount a peripheral circuit composed of a switching circuit comprising thin-film transistors (hereinafter abbreviated as "TFT") for switching pixels, a sample and hold circuit, a shift register, or the like on the periphery of pixels on a substrate.

Hitherto, there has been generally used the technique that a monocrystalline silicon substrate having a semiconductor circuit formed thereon is divided into chips and arranged on a display element substrate. These chips are called "COG (Chip On Glass)" and a method called a "TAB (Tape Automated Bonding)" has been used to connect these circuits. However, a limit of connection pitch of TAB is said to be approximately 40 $\mu$m and the method is not applicable to a display device having resolution equal to or higher than this.

On the other hand, in the field of liquid crystal display elements, it is a general practice in recent years that low temperature polycrystalline silicon transistors are used to form a peripheral circuit such as sample and hold circuit on the substrate of the display element. However, fabricating the entire control circuit for a display element using monocrystalline silicon has not been realized because of its low electron mobility. Though the term "low temperature" is used, it requires a temperature on the order of 500° C. and the substrate of the display element is required to have high heat resistance.

To compensate both defects, there is a need for a novel mount technique capable of forming a transistor circuit using monocrystalline silicon or the like on the substrate of the display element.

As a solution to this, U.S. Pat. No. 6,005,284 proposes to use a process which consists of forming a monocrystalline silicon layer on a semiconductor substrate through a porous layer, forming a desired semiconductor circuit thereon, bonding a desired support substrate to the semiconductor circuit, separating the semiconductor substrate from the porous layer using an external force (pulling force) and thereby transferring the semiconductor circuit to the support substrate.

However, according to this process, the separating step is performed with a pulling force, which is an external force, and therefore local distortion or the like is applied particularly to a part of the semiconductor circuit formed in the semiconductor layer, which may damage the semiconductor circuit or impair the device characteristic. Such a problem may occur more frequently as the transfer area increases.

As stated above, the conventional method cannot accommodate a high temperature process required in the formation of a semiconductor circuit to form a display element or a display device having a circuit which has a lower heat resistance, and the conventional method thus suffers from many problems such that it is difficult to improve the device characteristic of the semiconductor circuit or that the element characteristic is unstable when the element is formed at an insufficient temperature, thus making it also difficult to improve yield.

Thus, there is a need for a display element that reduces heat stress applied to the substrate of the display element and operates stably.

SUMMARY OF THE INVENTION

The present invention has been accomplished to solve the above-described problems and it is an object of the present invention to form a semiconductor circuit on a low heat-resistance substrate including plastics or the like, having flexibility and provide a display element and a display device, and provide a process of producing the same.

According to a first aspect of the present invention, there is provided a display device comprising an image display element section and at least one of a switching circuit section and a peripheral circuit section for driving the image display element section disposed on a first substrate, wherein the at least one of switching circuit section and peripheral circuit section is formed by performing one or more times a forming step of forming a circuit section comprising the at least one of switching circuit section and peripheral circuit section in a circuit film disposed on a second substrate and a transferring step of transferring and disposing the circuit film having the circuit section formed therein on the first substrate.

It is preferred in the present invention that the material constituting the at least one of switching circuit section and peripheral circuit section comprises an organic semiconductor, amorphous silicon, polycrystalline silicon or monocrystalline silicon.

Further, it is preferred that the circuit film comprises a semiconductor element, a semiconductor integrated circuit, or an element of a metal/insulator/metal stack structure (MIM structure).

It is more preferred that the circuit film comprises at least one of a semiconductor element and a semiconductor integrated circuit formed in a monocrystalline silicon layer.

Moreover, it is preferred that the display device has a configuration such that the switching circuit section is disposed on a first surface of the first substrate and at least a part of the peripheral circuit section is disposed on a second surface of the first substrate.

According to a second aspect of the present invention, there is provided a process of producing the display device set forth above, comprising the following steps (1), (2), (3), (4) and (5):

(1) a step of preparing a second substrate comprising a separation layer and a semiconductor film successively stacked on a substrate;

(2) a forming step of forming at least one of switching circuit section and peripheral circuit section in the semiconductor film to form a circuit film;

(3) a separating step of separating the circuit film from the second substrate;

(4) a transferring step of transferring and disposing the circuit film onto the first substrate; and (5) a step of forming an image display element section on the circuit film, provided that each step is performed at least once (or at least one time).

It is preferred in the present invention that the second substrate is a semiconductor substrate, and the formation of the circuit film comprises a step of forming a separation layer on the surface of the semiconductor, a step of forming a semiconductor film on the separation layer, and a step of forming the circuit section comprising at least one of a semiconductor element and a semiconductor integrated circuit in the semiconductor film.

Furthermore, it is preferred that the transferring step comprises a bonding step of bonding the circuit film to the first substrate and a separating step of separating the circuit film from the second substrate.

Further, it is especially preferred that the separation layer is a porous silicon layer.

Moreover, it is preferred that the semiconductor film comprises at least one of monocrystalline silicon and a chemical compound semiconductor.

Furthermore, the present invention includes both a process of transferring a number of the circuit films all together from the second substrate to the substrate on which the display device is formed and a process of cutting the circuit film prior to the transferring step and then transferring the circuit film divided into chips to the first substrate.

Furthermore, in the above transferring step, the circuit film may be transferred to the first substrate through a third substrate.

DESCRIPTION OF THE PREFERRED EMBODIMENTS

Display Device Configuration

A configuration of a display device of the present invention will be explained below.

First Embodiment

With regard to the configuration of the display device of the present invention, a first embodiment will be explained in detail below with reference to FIGS. 1A and 1B.

Figure 1A:
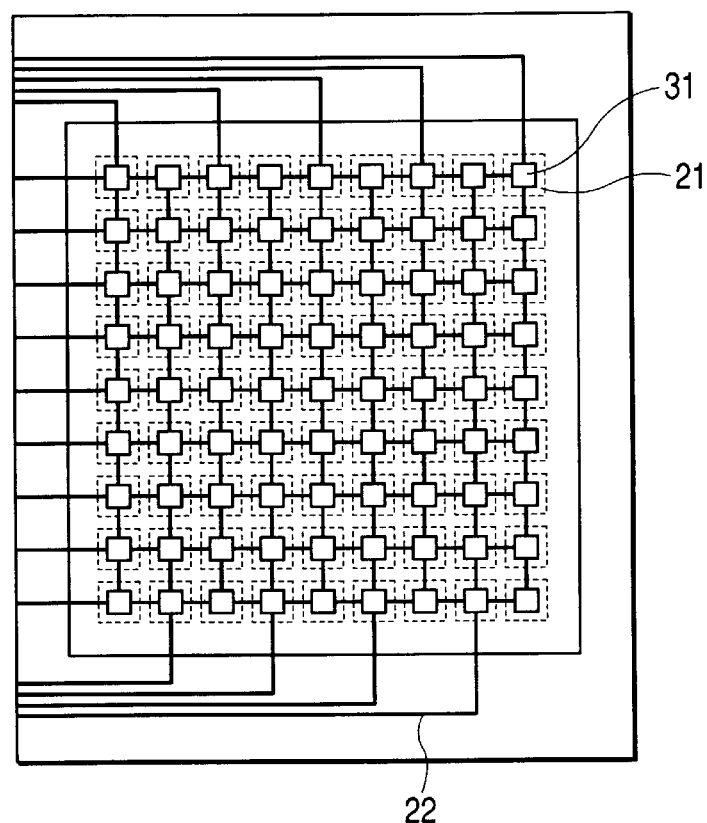
FIG. 1A is a schematic plan view showing an example of the display device of the present invention, wherein a circuit film 34 in which a switching circuit section 3 including switching circuits 31 corresponding to respective pixels 21 is formed is transferred to and disposed on a substrate 1 and a display section 2 is formed thereon
Figure 1B:
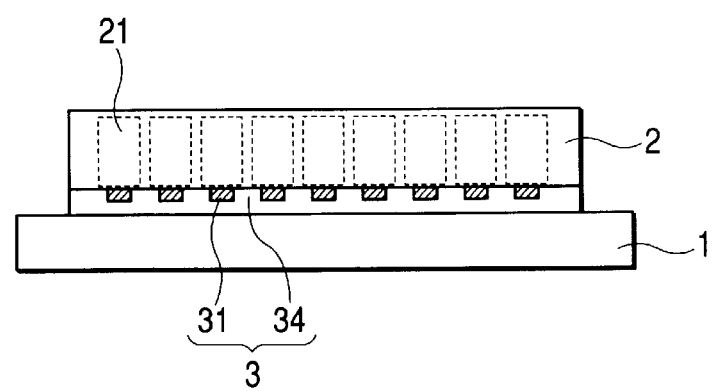
FIG. 1B is a cross-sectional view of FIG. 1A.

FIG. 1A is a plan view showing a schematic configuration of the display device of the present invention and FIG. 1B is a cross-sectional view thereof. According to this embodiment, a circuit film 34 that makes up a switching circuit section 3 is a single film and includes all integrated switching circuit sections 31. That is, it is a display device consisting of the switching circuit film 34 and a display section 2 stacked on a substrate 1 in the mentioned order. Here, the switching circuit section 3 for image formation is formed by peeling the circuit film 34 including a plurality of the switching circuits 31 formed on a second substrate which is different from the substrate 1 and transferring and disposing the circuit film 34 onto the substrate 1.

The substrate 1 serves as the substrate for a display element and can be made of not only a rigid material such as a glass or silicon wafer but also a plastic material such as polyimide, acrylic resin, polyethylene terephthalate (PETP) and polyether sulfone (PES), having flexibility.

For the switching circuit sections 31, two-terminal elements such as MOS diodes or MIM non-linear elements can be used in addition to three-terminal elements typified by MOS transistors.

For the display element section 2, a conventionally known display element such as a liquid crystal display (LCD), electro-luminescence (EL) display, electrophoretic display, microcapsule type electrophoretic display, in-plane type electrophoretic display, twisting ball display, or the like can be used.

In FIGS. 1A and 1B, the image drive switching circuit 31 is disposed approximately at the center of the pixel 21, but the positional relationship is not particularly limited. Furthermore, wires 22 are connected to a circuit substrate (not shown) having a peripheral circuit or the like, as a control circuit to drive the switching circuit sections 31 using flexible wiring (FPC), etc. Furthermore, a part of an IC chip, which is a component of the peripheral circuit, may also be disposed on the substrate 1.

A circuit substrate (not shown) having the peripheral circuit or the like may also be disposed on the back of the substrate 1 or a housing different from the one for housing the substrate 1 is prepared and the circuit substrate may be disposed therein. Furthermore, in FIGS. 1A and 1B, the switching circuit section 3 and the display section 2 are directly stacked on the substrate 1 in the mentioned order, but an insulating layer, flattening layer, wire, or the like may also be formed between those sections as needed.

To connect the display section 2, the switching circuit section 3 and the wires 22, a conventionally known technique, that is, contact holes, an anisotropic conductive film (abbreviated as "ACF"), wire bonding, gold bump, or the like can be used.

Figure 15:
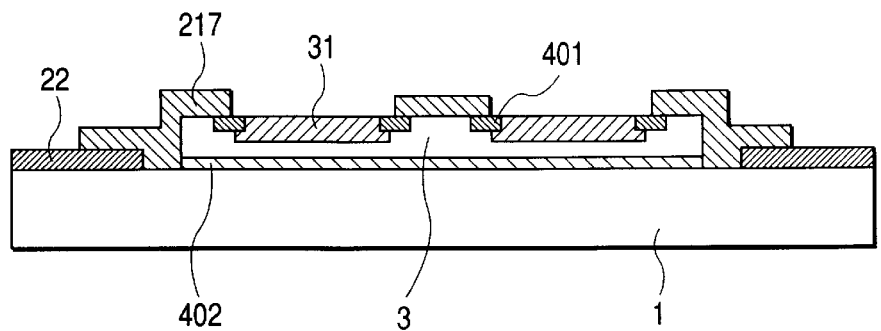
FIG. 15 is a schematic view illustrating a circuit film of the present invention face-up mounted on a substrate, wherein a circuit film 3 is bonded to a substrate 1 through an adhesive layer 402, contact with electrical wires 22 on the substrate 1 is made through metallization 217, which makes connections including terminal sections 401 in the switching circuits 31 simultaneously.

Furthermore, when the switching circuit section 3 is disposed in the direction of face up (i.e., with the terminal of the circuit positioned on the outermost layer side) with respect to the substrate 1, metallization can be used for connections as shown in FIG. 15.

That is, when the circuit film is very thin (normally, 1 $\mu$m or less), even if the metal film is formed directly in the thickness direction of the circuit film, there is no fear of wire breakage at step portions of the circuit film. To reduce the probability of wire breakage, it is of course effective to form the end face of the circuit film in a slope shape using a technique like anisotropic etching.

Second Embodiment

Figure 2A:
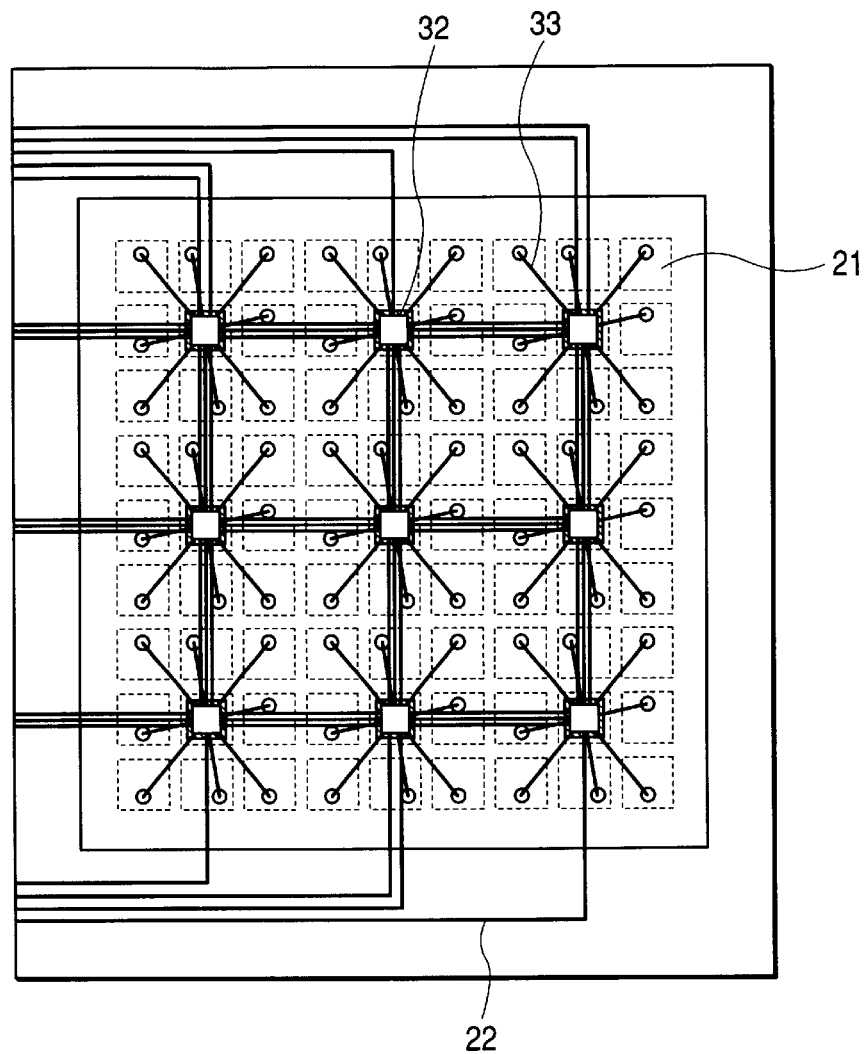
FIG. 2A is a schematic plan view showing an example of the display device of the present invention, wherein integrated circuit films 32 are disposed such that each circuit film drives nine (9) pixels
Figure 2B:
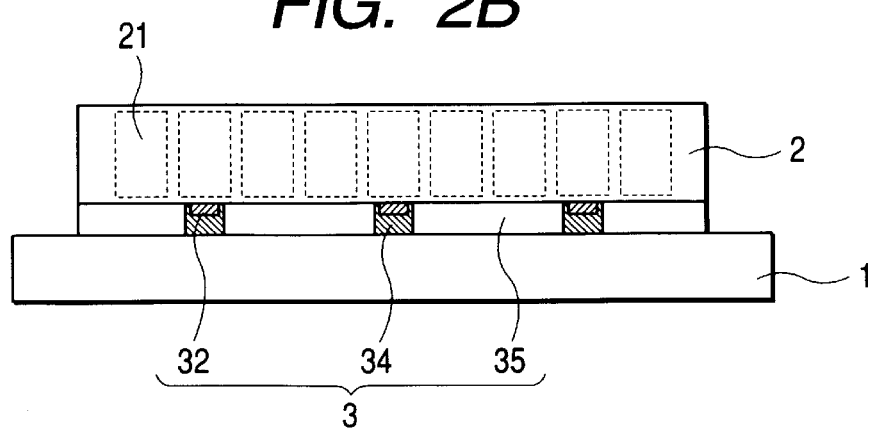
FIG. 2B is a cross-sectional view of FIG. 2A.

A second embodiment of the display device of the present invention is shown in FIGS. 2A and 2B.

This embodiment shows an example where the display device is constructed, divided into a plurality of circuit films. That is, the switching circuit section 3 consists of a plurality of circuit films 34 which are formed by integrating switching circuits 32 disposed on a substrate 1.

It is effective to insert flattening layers 35 made of a polymeric material into gaps between the circuit films 34 as needed so that a display element is formed thereon.

In FIGS. 2A and 2B, one integrated switching circuit 32 drives a total of 9 display elements 21 through inter-circuit wires 33, but it is also possible to arrange independent circuit films 34 pixel by pixel.

Such a configuration whereby a plurality of circuit films on which switching circuits are formed to constitute the switching circuit section 3 is especially effective when the size of the display device is large.

Third Embodiment

Figure 3A:
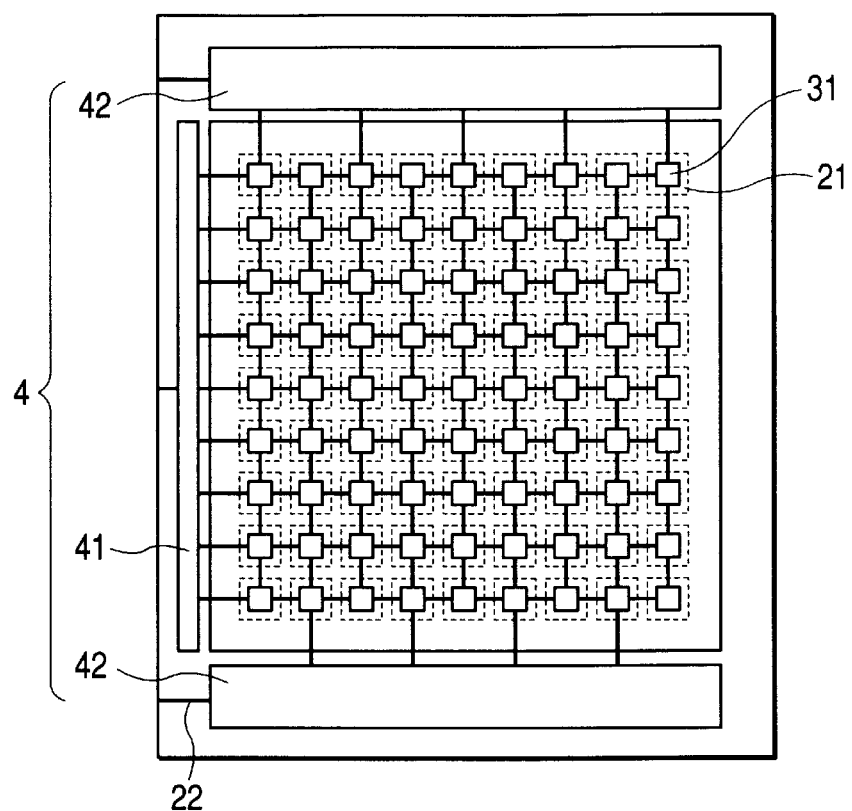
FIG. 3A is a schematic plan view showing an example of the display device of the present invention, wherein a peripheral circuit section 4 including a scanning line drive circuit 41 and a data line drive circuit 42 is transferred and disposed
Figure 3B:
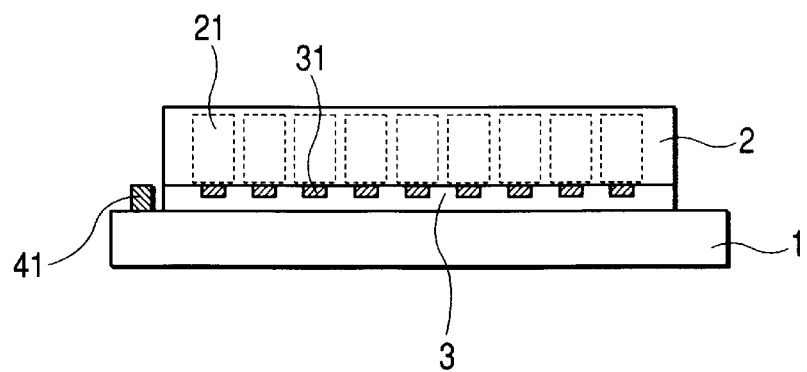
FIG. 3B is a cross-sectional view of FIG. 3A.

A third embodiment of the display device of the present invention is shown in FIGS. 3A and 3B.

This embodiment shows an example where a display device is formed by transferring and disposing a switching circuit section 3 comprised of a circuit film in which a plurality of separately prepared switching circuits 31 are formed, the peripheral circuit section 4 constitute of a display element scanning line drive circuit 41 and data line drive circuit 42 onto a substrate 1.

Compared to the process of mounting with COG used in the first embodiment, this embodiment has an advantage of being able to drastically reduce the number of wires 22 for connection with an external peripheral circuit. This reduces the number of connections of electric wires and increases the reliability in mounting the peripheral circuit section.

In FIGS. 3A and 3B the circuit film having the scanning line drive circuit 41 formed therein and the circuit film having the data line drive circuit 42 formed therein are separated from the circuit film having the switching circuits 31 formed therein, but these circuits can be integrated into a single circuit film.

Unless the size of the display device is too large, using an integrated circuit film can reduce a cost involved in the wiring between the switching circuits and drive circuit, and is therefore preferable. On the contrary, when the size of the display device is large, it is effective to subdivide the peripheral circuit section 4 and dispose members including many circuit films appropriately.

Incidentally, when metallization is available for electrical connections between the circuit films and the wires of the display elements, even if a plurality of members including the circuit films are used, there is no need to consider a cost increase involved in the increased number of connecting wires.

On the other hand, this embodiment constitutes the switching circuit section 3 with a circuit using monocrystalline silicon, but it is also possible to constitute switching circuit using organic semiconductor. As the organic semiconductor switching circuit, it is possible to use an organic semiconductor transistor material described in Tech. Dig. -Int. Electron Devices Meet. (1999), pp. 111–114 by D. Gundlach et al., and *Conference Record of IDRC 2000*, pp. 411–414 by T. N. Jackson et al.

The switching circuit using an organic semiconductor is inferior to that of monocrystalline silicon in electrical characteristics such as mobility, but is advantageous in that especially when a plastic film is used for the display element substrate, because the organic semiconductor has a thermal expansion coefficient similar to that of the substrate, there is no defect of peeling off upon change in the environmental temperature, or the like, thus increasing the stability of the element.

Furthermore, this embodiment shows an active matrix type display element using the switching circuit sections for the display element section, but even for a passive matrix type display device which uses no such switching circuit sections the present invention is very effective when the peripheral drive circuit section is disposed around the display element.

Thus, taking the electrophoretic display system as an example, although it is a display system which originally shows no threshold characteristic, it is possible to provide a pseudo threshold characteristic by adding a control electrode or the like. This makes it possible to provide passive matrix drive through an XY matrix type wiring, and forming a peripheral circuit section using the technology of the above-described embodiment makes it possible to form a display device at low cost.

Furthermore, by transferring and disposing a circuit film in which in addition to the peripheral circuit section, known information input/output circuit, memory, processor, wireless communication circuit, solar battery, and so on are formed, to the periphery of the display element using the process of the present invention, it is possible to mount most of circuit sections necessary for the display device on the substrate 1 of the display element.

Of course, these circuit films may be either in the form of separate chips or integrated into a single chip. As members for constituting various semiconductor circuits, it is also possible to independently select and dispose members of monocrystalline silicon, organic semiconductor, amorphous silicon, polycrystalline silicon, or the like according to the features of the respective circuits. This makes it possible to form digital paper provided with all functions on one sheet of sheet-like display element.

Fourth Embodiment

Figure 4A:
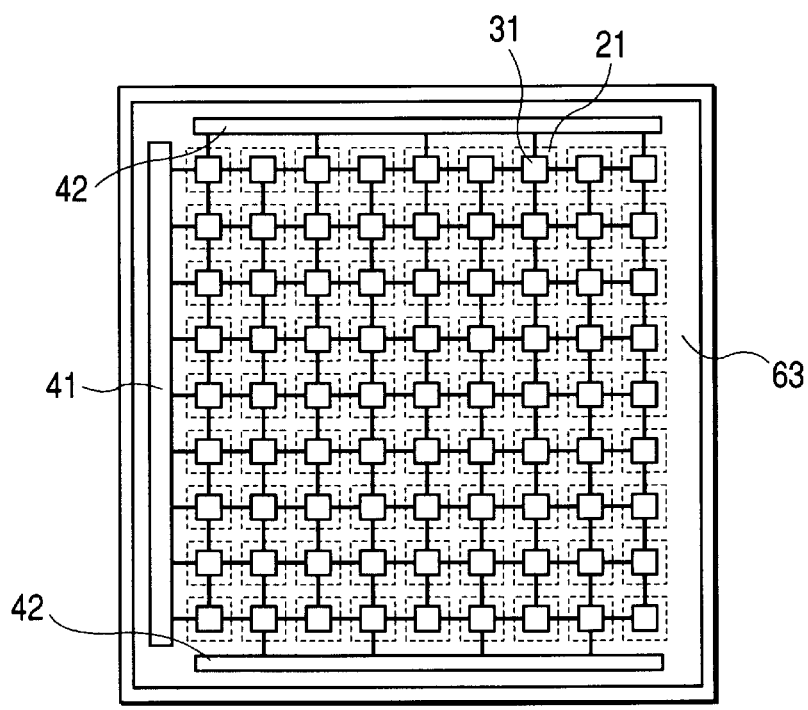
FIG. 4A is a schematic plan view showing an example of a display device of the present invention, illustrating an element formed by disposing a circuit film 64 having a peripheral circuit formed therein on a substrate 1, stacking and disposing a circuit film 63 having a circuit for driving switching circuits formed therein on the film through a flattening layer 61 and stacking a display section 2 thereon
Figure 4B:
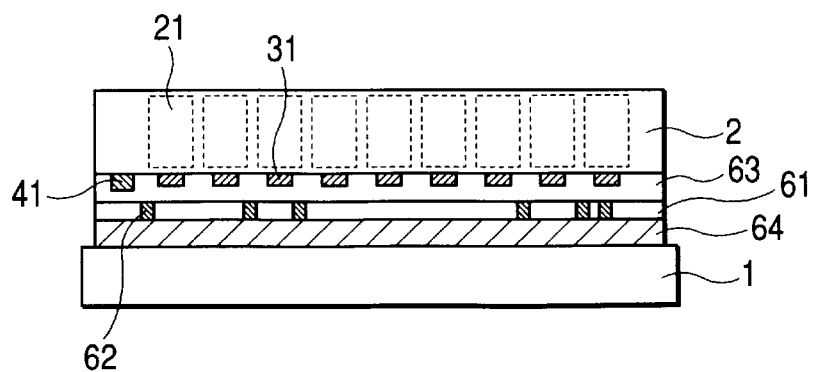
FIG. 4B is a cross-sectional view of FIG. 4A.

A fourth embodiment of the display device of the present invention is shown in FIGS. 4A and 4B.

A peripheral circuit section 64 is formed on a substrate 1 first and then a flattening layer 61 is disposed thereon. On top of this, a switching circuit section 63 and a display section 2 are stacked in the mentioned order. In FIG. 4B, the flattening layer 61 is formed between the peripheral circuit section 64 and the switching circuit section 63, and contact holes 62 are formed to provide electrical connections. Instead of the contact holes, it is also possible to provide connections using techniques such as wire bonding, ACF, or the like. Furthermore, it is also preferable to provide connections using metallization.

The peripheral circuit section 64 is constructed by arranging members comprising circuit films on which scanning line drive circuit 41, data line drive circuit 42, memory, processor, wireless communication circuit, external input/output circuit, and so on are formed appropriately.

These members need not always be directly disposed on the substrate 1, but, for example, it is also possible to dispose a thin film type battery between the peripheral circuit section 64 and the substrate 1. In FIG. 4B, the peripheral circuit section 64 is depicted continuously as a single layer, but it may also be constructed of a plurality of circuit films or in a multi-layer configuration, as needed. In this case, it is possible to provide a flattening layer or inter-layer insulating layer between the layers. Furthermore, because this peripheral circuit section 64 is sufficiently thin, even when the circuit sections are stacked, it is possible to connect the respective circuits through metallization.

As the switching circuits 31 shown in FIGS. 4A and 4B, it is also possible to use switching circuits made of an organic semiconductor formed using a technique such as printing, or switching circuits mainly comprised of conventionally known thin film transistors using amorphous silicon or polycrystalline silicon.

Furthermore, as in the case of a simple matrix display element, it is also possible to omit the switching circuit section 63 depending on the type of the display section.

Furthermore, it is also possible to dispose a part of a peripheral circuit in the same plane as that of the switching circuit section 63. In this case, the switching circuits and peripheral circuits may be formed in a member having different circuit films or may be formed in a member having the same circuit film.

Especially as shown in FIGS. 4A and 4B, when the switching circuits 31, the scanning line drive circuit 41 and the data line drive circuit 42 for driving the switching circuits 31 are formed in the same circuit film, it is possible to further secure wiring between the switching circuits and the drive circuits.

This configuration can minimize the area of the margin in the periphery of the display section 2 required for the substrate 1 compared to the case where the peripheral circuit is disposed in the periphery of the display section 2.

Fifth Embodiment

Figure 5A:
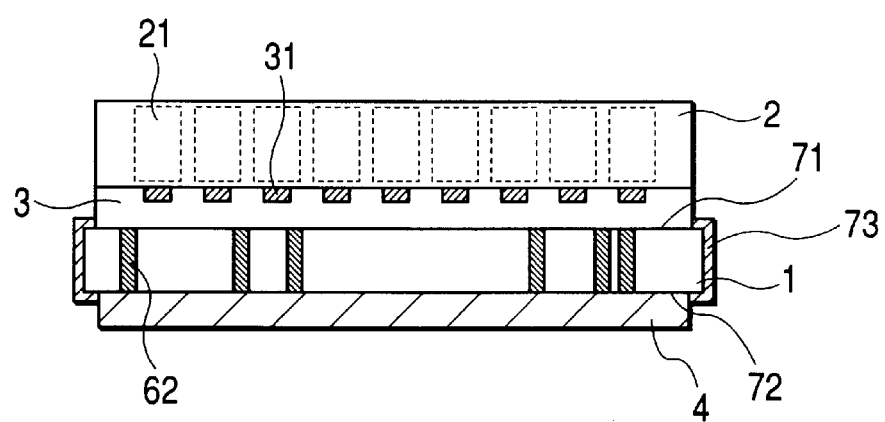
FIGS. 5A and 5B are schematic cross-sectional views showing examples of the display device of the present invention, illustrating examples where a peripheral circuit section 4 is disposed on the back side of a substrate 1 of a display element, FIG. 5A illustrating the example wherein the peripheral circuit section 4 is directly bonded to the substrate 1 and FIG. 5B illustrating the example wherein the peripheral circuit section 4 is bonded through a third substrate 74 to the substrate 1, in which electrical connections with a circuit film 3 on the opposite side is made through an FPC 73.
Figure 5B:
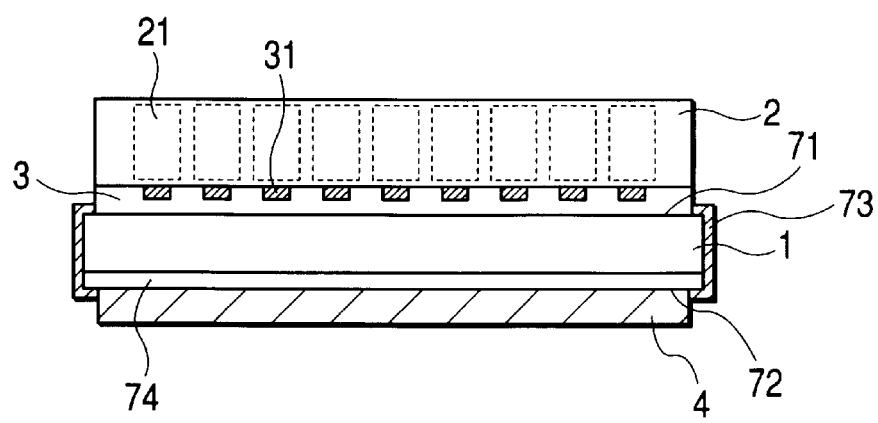

A fifth embodiment of the display device of the present invention is shown in FIGS. 5A and 5B.

FIG. 5A shows an example where a switching circuit 3 and a display section 2 are formed on a first surface 71 of a substrate 1 and a peripheral circuit section 4 is formed on a second surface 72 which is a back surface of the substrate 1.

Connection between the circuit formed on the first surface 71 of the first substrate and the circuit formed on the second surface 72 is provided by contact holes 62 that penetrate the substrate 1 or flexible wire (FPC) 73. It is also possible to form a part of the peripheral circuit, for example, the scanning line drive circuit and data line drive circuit on the first surface 71 and to form the remaining peripheral circuit section on the second surface 72. This allows the number of wires for connection between the first surface 71 and the second surface 72 to be reduced. Furthermore, the switching circuit section 3 and peripheral circuit section 4 may be constructed of a plurality of layers as needed.

FIG. 5B shows an example where a circuit film comprising the peripheral circuit section 4 is transferred and disposed on, for example, a film substrate (third substrate) 74 and then disposed on the second surface of the substrate 1 through the film substrate.

This is a case where a bare IC chip used for mounting of a conventionally known Chip On Film (COF) or System On Film (SOF) is altered to the circuit film as transferred and disposed.

The switching circuit section 3 can also be constructed by transferring and disposing onto the first substrate 1 a separately prepared circuit film comprising a plurality of switching circuits formed on a second substrate. Furthermore, the switching circuit section 3 can also be mainly formed of thin film transistors using any one of an organic semiconductor, amorphous silicon or polycrystalline silicon.

Process of Producing Circuit Film

Then, a process of producing a circuit film for constituting the display device of the present invention will be explained in detail below.

Sixth Embodiment

A process of producing a circuit film will be explained with reference to FIGS. 6A to 6D.

Figure 6A:
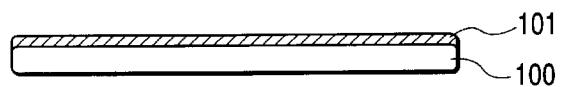
FIGS. 6A, 6B, 6C and 6D are schematic cross-sectional views showing a process of forming a circuit film used in the present invention, wherein a separation layer 101 is formed on a substrate 100, a semiconductor film 102 is formed thereon, a switching circuit 103 is formed therein and a circuit film 105 is then taken out by separation at the separation layer.

First, a separation layer 101 is formed on a semiconductor substrate 100 (FIG. 6A). As the semiconductor substrate 100, there can be used a monocrystalline silicon wafer made by the CZ method, MCZ method, FZ method, etc. or a wafer having a hydrogen-annealed substrate surface or an epitaxial silicon wafer, or the like. Furthermore, not only a silicon wafer but also a chemical compound semiconductor substrate such as a GaAs substrate or InP substrate can be used.

There are processes of forming the separation layer 101 such as a process using a porous layer formed by anodization and a process using ion implantation whereby ions of hydrogen, nitrogen or a rare gas such as helium are implanted. The reason why a porous layer functions as a separation layer is that the formation of the porous layer causes large crystalline distortion to be formed near its interface, thus making the separation easier.

However, when the porosity of the porous layer is increased extremely or abruptly, crystalline distortion increases excessively, which may partially cause natural peeling off. Thus, for example, the separation layer 101 is constructed of a plurality of layers differing in porosity, for example, in a two-layer configuration of a high-porosity layer and a low-porosity layer from the semiconductor substrate side. Furthermore, the separation layer 101 may also be constructed in a three-layer configuration of a low-porosity layer, a high-porosity layer and a low-porosity layer from the semiconductor substrate side.

Here, the porosity of the high-porosity layer is available in a range of 10% to 90% while the porosity of the low-porosity layer is available in a range of 1% to 70%. Layers of different porosities can be implemented by changing a current density during anodization or changing the type or concentration of an anodizing solution.

When a porous layer is formed by anodization, it is recommendable to perform a protection film forming step of providing a protection film such as a nitride film or oxide film inside the pores of the porous layer or a heat treatment step at 800 to 1000° C. in an atmosphere containing hydrogen prior to growing a semiconductor film 102 on the separation layer 101 comprised of the porous layer.

It is also preferable to perform both of these two steps, that is, perform the protection film forming step and then perform the heat treatment step. It is further preferable to perform, after the heat treatment step, a second heat treatment at a further higher temperature in a temperature of not less than 900° C. but less than the melting point. For example, the first heat treatment step is performed at 950° C. and the second heat treatment step is performed at 1100° C. By these treatments, pores in the surface of the porous layer are sealed.

The porous layer as formed has elongated fine pores extending in a direction approximately perpendicular to the surface of the substrate and maintains the crystallinity of the original substrate. It is possible to use the porous layer in a thickness on the order of several hundreds of $\mu$m to 0.1 $\mu$m.

When an ion-implanted layer is used as the separation layer 101, peeling off of the separation layer will occur due to heat treatment at about 400–600° C. Thus, there is a possibility that high-temperature treatment can no longer be performed in the step of forming circuits such as a circuit element and/or integrated circuit, which will be described later. Thus, it is preferable to perform the circuit element forming step and/or the integrated circuit forming step first and then perform ion implantation to a predetermined depth to thereby form the separation layer 101 comprising the ion implanted layer. In this case, it is preferable to cover the surface of the circuit element and/or the integrated circuit with a protection film.

Figure 6B:
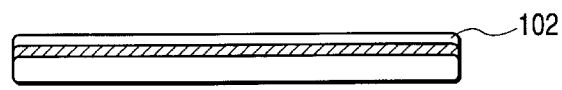

Then, a semiconductor film 102 is deposited on the separation layer 101 (FIG. 6B).

This step is unnecessary when an ion-implanted layer is used as the separation layer 101. For the formation of the semiconductor layer 102, there can be used a conventionally known film formation method such as the CVD method, MBE method, sputtering method, or the like. When the semiconductor layer 102 is to be grown according to the CVD method, it is preferable to effect the growth at a low growth rate of 20 nm/min or less up to a predetermined thickness (e.g., 10 nm). Here, because the porous layer maintains the crystallinity, it is possible to allow a semiconductor film to epitaxially grow on the porous layer.

Furthermore, as the semiconductor film 102, it is possible to use a monocrystalline silicon thin film or a chemical compound semiconductor film such as of GaAs, InP, GaN, etc. When the semiconductor film is monocrystalline silicon, it is possible to add a $SiH_2Cl_2$, $SiHCl_3$, $SiCl_4$, $SiH_4$ or HCl gas as a raw material gas.

Figure 6C:
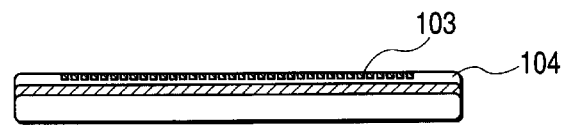

Then, a switching circuit 103 comprised of a circuit element and/or integrated circuit is formed in the semiconductor film 102 (FIG. 6C).

To form the circuit element and/or integrated circuit, conventionally known processes of producing various devices can be used. As the switching circuit, a conventionally known circuit may be used and constructed by combining, for example, MOSFETs and capacitors appropriately.

Figure 6D:
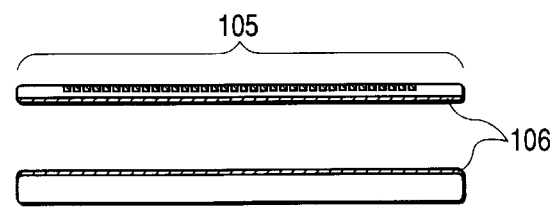

Then, the semiconductor film 102 having the switching circuits 103 formed therein (this combination is referred to as "circuit film 104") is peeled off or separated by the separation layer 101 to obtain a circuit film 105 (FIG. 6D).

When a porous layer is used as the separation layer 101, it is possible, as a specific technique for separation, to mechanically peel off the porous layer by applying a pulling force, compressive force or shearing force to the separation area while holding the members using a vacuum chuck or the like, or to effect separation by application of ultrasonic vibration or local heating.

However, from the standpoint of avoiding damage to the circuit due to a local stress applied to the circuit during separation, it is preferable to use a process of utilizing a pressure of a fluid. As a process of applying a pressure of a fluid, a fluid such as a liquid or gas is blown against the side surface of the separation layer 101 as a high-pressure jet. As a liquid therefor, water, etching liquid, alcohol, or the like can be used. When a liquid is used, ultrasonic waves may also be applied simultaneously. Furthermore, air, nitrogen gas, argon gas, or the like can be used as the gas. Further, it is also possible to add to the fluids solid particles or powder such as ice or plastic pieces, an abrasive, etc.

Alternatively, the separation layer may also be separated by applying a static pressure thereto. Applying a static pressure requires a sealed space constituting member for constituting a sealed space by enclosing at least a part of the periphery of the semiconductor substrate 100 and a pressure application mechanism capable of applying a pressure higher than the pressure of the external space to the inside of the sealed space.

A fluid has an advantage that it can flow even into very fine spaces to increase the internal pressure and an external pressure can be applied thereto in dispersed state. Furthermore, because no extreme pressure is applied locally to a specified part, the fluid has the feature of being able to selectively allow the most easily separable part to be separated. As in the case of the present invention, the fluid is the best means for separating the entire thin film on which the thin-film device (circuit) has already been made.

Furthermore, when an ion-implanted layer into which ions of hydrogen, nitrogen or a rare gas such as helium have been implanted is used as the separation layer 101, heat treatment at about 400–600° C. is applied thereto to effect the separation utilizing a phenomenon in which a fine bubble layer formed by the ion implantation will coagulate. For heat treatment, it is possible to use a laser such as $CO_2$ laser, etc.

After the above-described separating step, a part of the separation layer 101 (hereinafter referred to as a "residual separation layer 106") may remain in the member 105 having the circuit film. This residual separation layer 106 may be removed by polishing, grinding, etching, or the like, as needed. Alternatively, it may be left and subjected to heat treatment in an atmosphere containing hydrogen.

Incidentally, when a silicon wafer is used as the semiconductor substrate 100, the residual silicon area is depleted to have a high resistance. This makes it possible to realize high-speed, small power-consumption devices of a SOI type and the residual silicon area can thereby be used without being removed if there is no special problem.

The remaining semiconductor substrate 100 can be used repeatedly to produce a member having the above-described circuit film.

In the above-described explanation, the switching circuits 103 are formed in the semiconductor film 102 and then the circuit film 104 is formed, but the circuits to be formed are not limited to the switching circuits and include peripheral circuits for constituting the display device such as a shift register circuit, logical operation circuit, booster circuit, memory circuit, wireless reception circuit, CPU circuit, DSP circuit, electromagnetic induction circuit, battery, sensor circuit, etc.

Furthermore, the film to be stacked on the separation layer 101 is not limited to a semiconductor film, and it is also possible to use an insulating film such as a silicon oxide film and to form an MIM structure element or the like thereon to constitute a circuit film. It is also possible to deposit a semiconductor film thereon through such an insulating film and form a circuit and/or an integrated circuit on this semiconductor film to constitute a circuit film.

Seventh Embodiment

Figure 7A:
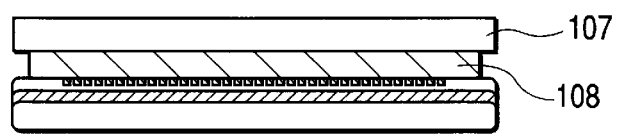
FIGS. 7A and 7B are schematic cross-sectional views showing another process of forming a circuit film used in the present invention, wherein a support substrate 107 is bonded and then separated at a separation layer.
Figure 7B:
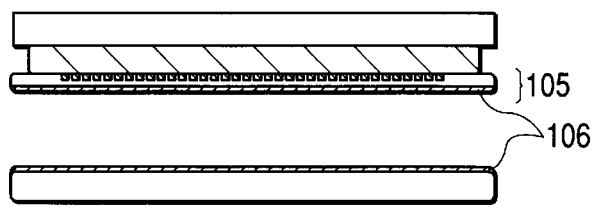

Another embodiment of a process of producing a member having a circuit film will be shown in FIGS. 7A and 7B.

After forming a circuit film 104 in the same manner as in the sixth embodiment and prior to a separation step, a support substrate 107 is bonded to the circuit film through an adhesive layer 108 (FIG. 7A). Then, peeling/separation is performed with the separation layer being used as a boundary (FIG. 7B).

As the adhesive layer, an epoxy type adhesive or other adhesives can be used. When a liquid is used in the separation step, it is preferable to use a non-aqueous adhesive if the liquid is an aqueous one and to use an aqueous adhesive if the liquid is a non-aqueous one. Although the support substrate 107 is bonded to the member 105 having the separated circuit film through the adhesive layer 108, it is possible either to remove the adhesive layer 108 and support substrate 107 and then transfer and dispose the member having the circuit film onto the substrate for constituting the display device or to transfer and dispose the member having the circuit film onto the substrate with the support substrate bonded thereto and then remove the adhesive layer 108 and support substrate 107. If some residue of the adhesive layer remains on the surface of the circuit film 105, it may be removed as needed.

It is further possible to directly bond a substrate for forming the display device to the circuit film instead of the support substrate 107. Prior to the bonding, necessary wires are formed on the substrate. Necessary wire connection may also be performed in the bonding step by utilizing ACF or the like. In this case, connection members such as wires and bumps are beforehand formed on the substrate.

Adopting such a process makes it possible to transfer and dispose the circuit film onto the substrate at the same time as completion of the separation step and to also complete the wiring. Here, it is needless to say that the above-described substrate to which the circuit film has already been bonded can also be utilized.

Eighth Embodiment

Next, the process of producing a plurality of chip-like circuit films will be explained with reference to FIGS. 8A to 8C.

Figure 8A:
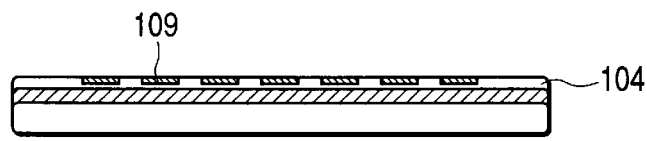
FIGS. 8A, 8B and 8C are schematic cross-sectional views showing yet another process of forming a circuit film used in the present invention, illustrating that a circuit film 109 is cut into chips and taken out, wherein cut grooves 110 are formed and then chips are separated at the separation layer.

As in the case of the foregoing embodiment, a circuit film 104 is first formed (FIG. 8A). The circuit film 104 is cut for each circuit or each aggregate block of several circuits to form a plurality of chips.

Figure 8B:
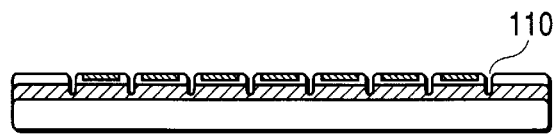
Figure 8C:
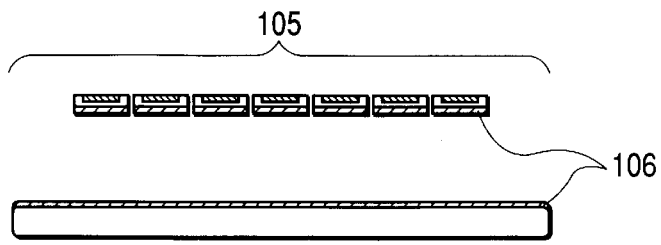

In FIGS. 8A to 8C, a peripheral circuit 109 is formed as the circuit (FIG. 8A), but it can also be a switching circuit. To divide the member having the circuit film into chips, cut grooves 110 are formed for each circuit or each aggregate block of several circuits (FIG. 8B).

The cut grooves 110 can be produced using a commonly used dicing apparatus. In addition, they can also be produced using etching, laser abrasion, ultrasonic cutter, high-pressure jet (e.g., water jet), or the like. In the case of etching, an etching liquid such as a mixture of HF and $H_2O_2$, a mixture of HF and $HNO_3$ or an alkali solution can be used. In the case of a laser, YAG laser, $CO_2$ laser, excimer laser, or the like can be used.

The depth of the cut grooves 110 need not necessarily reach the separation layer 101, but it is preferable that the cut grooves 110 reach the inside of the separation layer 101 or the vicinity of the interface between the semiconductor substrate 100 and separation layer 101. However, to reutilize the semiconductor substrate 100, it is preferable to form the cut grooves 110 in such as way that the cut grooves 110 do not reach the semiconductor substrate 100. When the separation layer 101 is comprised of a high porosity layer and a low porosity layer, it is preferable that the cut reaches the inside of the high porosity layer or the interface thereof. Incidentally, before forming the cut grooves 110, it is also possible to apply LOCOS (local oxidation) or mesa etching to areas between the chips that become individual chips so that no semiconductor film exists between the chips.

Then, the circuit film 104 is separated from the semiconductor substrate 100 and members 105 having the circuit film of the chip shape are produced (FIG. 8C).

Ninth Embodiment

Then, another embodiment for producing a circuit film 105 divided into chips will be explained with reference to FIGS. 9A to 9E.

Figure 9A:
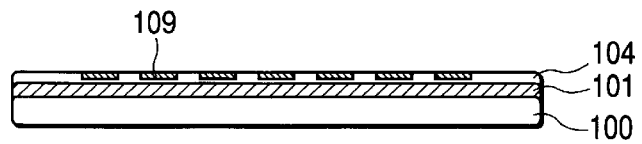
FIGS. 9A, 9B, 9C, 9D and 9E are schematic cross-sectional views showing still another process of forming a circuit film used in the present invention, illustrating that a circuit film 109 is cut into chips and taken out, wherein the circuit film 109 is bonded to a support substrate 107, cut grooves 110 are formed and the circuit film 109 is separated from an adhesive layer 108.

As in the case of the foregoing embodiment, a circuit film 104 is first formed (FIG. 9A).

Figure 9B:
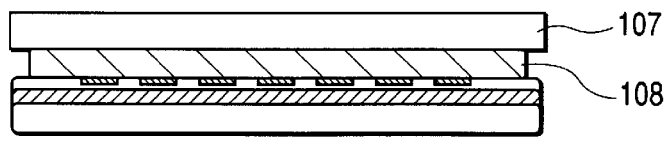

Prior to a separation step, a support substrate 107 is bonded onto the circuit film 109 through an adhesive layer 108 (FIG. 9B).

Figure 9C:
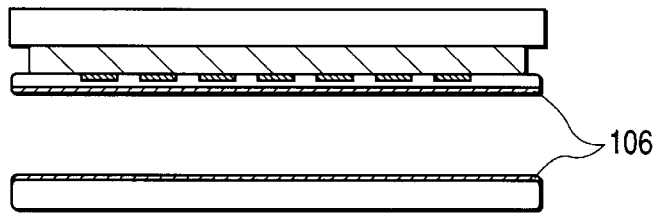
Figure 9D:
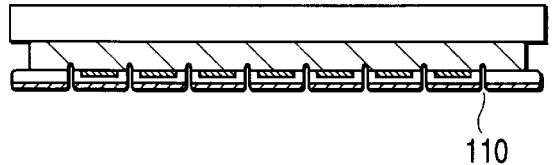
Figure 9E:
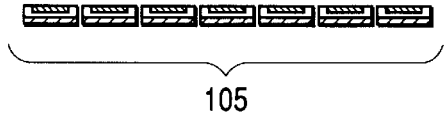

After the peeling/separating of the circuit film together with the support substrate (FIG. 9C), cut grooves 110 are formed on the circuit film side for each circuit or each aggregate block of several circuits (FIG. 9D).

In this case, the grooves 110 need not necessarily reach the adhesive layer 108. In this case, if, for example, the support substrate 107 is constructed of an elastic (or stretch) material, for example, a dicing film, it is possible to take out the circuit film 105 divided into chips by extending the film.

Although the support substrate 107 is bonded to the separated circuit film 105 through the adhesive layer 108, it is also possible either to remove the adhesive layer 108 and support substrate 107 and then transfer and dispose the circuit film onto the substrate for constituting the display device or to transfer and dispose the circuit film onto the substrate with the support substrate bonded thereto and then remove the adhesive layer 108 and support substrate 107.

The above-described embodiment shows an example where the cut grooves are formed on the circuit film side, but it is also possible to form the cut grooves in the whole body including the support substrate 107 and adhesive layer 108.

Furthermore, FIG. 9C shows the case where the cut grooves are formed after the semiconductor substrate 100 is separated, but it is also possible to form the cut grooves from the support substrate side to the circuit substrate with the semiconductor substrate 100 being bonded thereto as shown in FIG. 9B.

Process of Producing Display Device)

Then, a process of producing a display device of the present invention will be explained.

Tenth Embodiment

A process of producing a display device comprising a circuit film having switching circuits formed therein will be explained with reference to FIGS. 10A to 10G taking a case where a microcapsule type electrophoretic display is used for a display section as an example.

Figure 10A:
FIGS. 10A, 10B, 10C, 10D, 10E, 10F and 10G are schematic cross-sectional views showing an example of a display device of the present invention using microcapsules 207.

First, necessary wires 201 are formed on a substrate 200 (FIG. 10A). As the material for the substrate 200, a polymer film such as polyethylene terephthalate (PETP) and polyether sulfone (PES) or an inorganic material such as glass, quartz can be used.

The wires 201 may be formed not only by a sputtering or vapor deposition method but also by plating or printing. Depending on the configuration, the wires can also be formed after a circuit film 202 having switching circuits formed therein (which will be described below) has been disposed on the substrate 200.

Figure 10B:
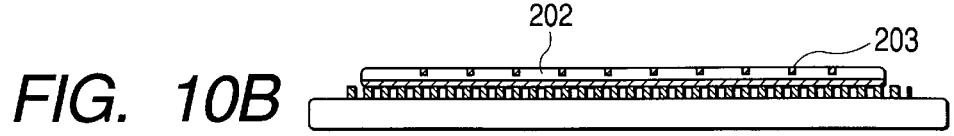

Then, the circuit film 202 having switching circuits 203 formed therein is bonded thereto through an adhesive (FIG. 10B). Prior to the bonding, a part or whole of the wires 201 may be covered with an insulating film as needed. In FIG. 10B, the side opposite to the circuit surface of the member having the circuit film is bonded to the surface of the substrate (face down connection), but it is also possible to bond the back of the circuit film to the surface of the substrate with the surface of the circuit facing up (face up connection).

In the case of the face down connection, connections can also be made using an ACF, which is used in a conventionally known flip chip mounting.

Furthermore, in FIG. 10B, one circuit film 202 having switching circuits formed therein is bonded, but a plurality of circuit films can also be bonded as in the case of the display device having the configuration shown in FIG. 2A.

Then, the circuit film 202 having switching circuits formed therein is connected to the wires 201 appropriately.

Figure 10C:
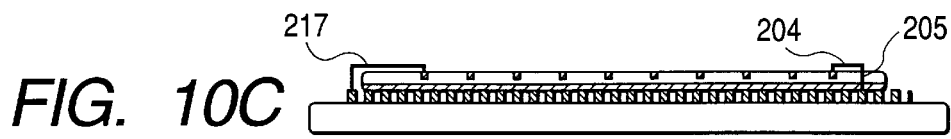

Alternatively, the layers may also be connected using a contact hole 205 if necessary (FIG. 10C). When the switching circuits 203 are formed, for example, of MOSFET, the gate of the MOSFET is connected to a data line and the source (or drain) is connected to a scanning line.

Figure 10D:
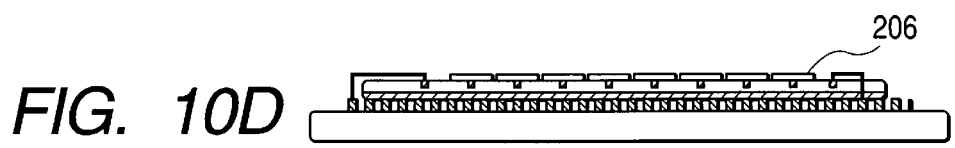

Then, first electrodes 206 of a display element are formed on the circuit film having the switching circuits formed therein (FIG. 10D). The first electrodes 206 correspond to pixels of the display element and if the switching circuits 203 are formed, for example, of MOSFET, they are formed so as to be connected to the drain (or source) of the MOSFET.

Alternatively, it is also possible to form the first electrodes after forming the circuit film, and then bond the member having the circuit film comprising the first electrodes formed therein to the substrate.

Figure 10E:
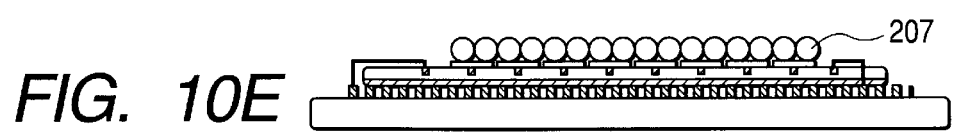

Then, a plurality of known microcapsule type electrophoretic cells 207 are disposed two-dimensionally on the first electrodes 206 (FIG. 10E). To fix the microcapsule type electrophoretic cells 207, a mixture of the cells with a support material such as silicon resin or acrylic resin is applied, for example.

The microcapsule cells used here can be any known ones, but use of ones of a small diameter reduces the contrast, and therefore it is desirable to use microcapsule cells of 20 $\mu$m or more in diameter. Furthermore, the microcapsule cells contain an insulating dispersion liquid and positively or negatively charged migrating particles, and the charged particles can move to a side of a predetermined electrode. In order to match the specific gravities of the charged particles and the dispersion liquid, it is possible to add a specific gravity adjusting agent or the like. Furthermore, it is also possible to adopt such a configuration as to contain two types of positively or negatively charged particles.

Figure 10F:
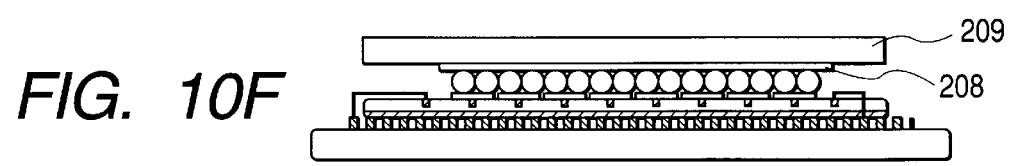

Then, a surface protection plate 209 having a second electrode 208 formed on a surface thereof is disposed on the microcapsule type electrophoretic cells 207 so that the first electrodes 206 and the second electrode 208 face each other (FIG. 10F). The surface protection plate 209 can be made of any material such as glass, plastic as long as it is transparent. Furthermore, the second electrode 208 is also required to have transparency, and therefore a transparent electrode material such as indium tin oxide (ITO) is used.

Incidentally, since the microcapsules are not necessarily mechanically strong, it is also possible to dispose a spacer (not shown) appropriately so as to keep an appropriate gap between the first electrodes 206 and the second electrode 208. As the spacer, it is possible to use various types of insulating beads used for a liquid crystal display device or to use those formed by pattering a large thickness resist layer. The gap should be 20–100 $\mu$m.

Furthermore, it is also possible to prepare a member consisting of a plurality of microcapsules 207 laminated on the surface protection plate 209 having the second electrode 209 formed on the surface thereof and bond the member to the first electrodes 206 to constitute the structure shown in FIG. 10F.

Figure 10G:
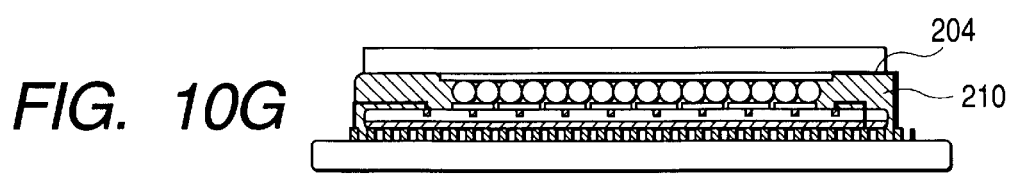

Finally, electrical connections with the second electrode 208 are made and sealing 210 is performed using an adhesive or the like, so that the microcapsule type electrophoretic display device is completed (FIG. 10G).

In the above-described explanation, the circuit film 202 having the switching circuits formed therein is bonded to the substrate 200 and then the display section is constructed in the mentioned order. Alternatively, after forming the display section on the circuit film beforehand, it is also possible to separate the thus united member from the separation substrate and bond the member to the display element substrate.

Furthermore, the microcapsule type electrophoretic display has been explained as the display section, but the display section is not limited to this display system and it is also possible to prepare and apply a necessary device configuration such as liquid crystal display, electrophoretic display, in-plane type electrophoretic display, twisting ball display, electric address system such as EL display or the like appropriately.

Eleventh Embodiment

Then, a process of producing a display device comprising a circuit film having switching circuits formed therein will be explained with reference to FIGS. 11A to 11G taking a case where an in-plane type electrophoretic display is used as the display section as an example.

As in the case of the embodiment shown in FIGS. 10A to 10C, a circuit film 202 having switching circuits formed therein is disposed on a display element substrate 200 and is connected 204 to wires 201 appropriately.

As pixel electrodes for display elements, first electrodes 206 are then formed on the circuit film having the switching circuits formed therein and an insulating layer 211 is formed thereon (FIG. 1D). If the switching circuits 203 are formed, for example, of MOSFET, the first electrodes 206 are formed so as to be connected to the drain (or source) of the MOSFET. Alternatively, it is also possible to form the first electrodes beforehand after forming the circuit film and then bond the circuit film having the first electrodes to the substrate.

As the material for the first electrodes, any conductive material that can be patterned may be used. However, the first electrodes 206 do not necessarily have a one-to-one correspondence with pixels, and can also be formed as the electrodes common to all the pixels. In such a case, a second electrode (which will be described later) that forms a pair with the first electrodes is divided according to the pixels and connected to the switching circuits 203.

Figure 12A:
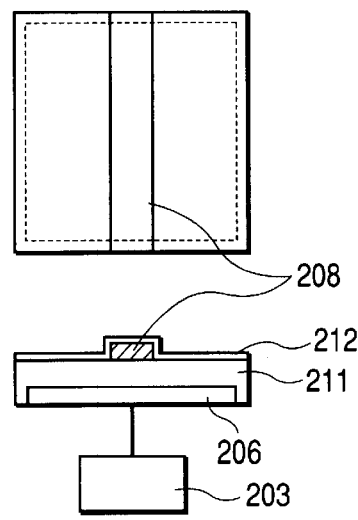
FIGS. 12A, 12B, 12C and 12D are schematic views illustrating an example of a pixel electrode applicable to an electrophoretic display element.
Figure 12B:
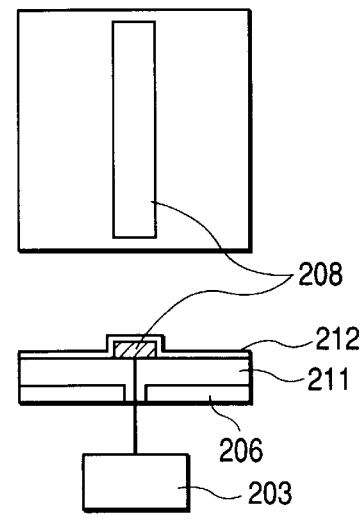

Configuration examples of the first electrodes and second electrode are shown in FIGS. 12A and 12B.

FIGS. 12A and 12B are schematic configuration diagrams for each pixel and the upper part is a plan view and the lower part is a cross-sectional view. First, the first electrode 206 is formed as a pixel electrode in the shape as shown in FIG. 12A and the second electrode 208 is provided as an electrode common to all pixels through an insulating layer 211.

When viewed from an observer, the area of the pixel occupied by the second electrode 208 is preferably smaller than that of the first electrode 206. An in-plane type electrophoretic display will produce a display contrast with a variation in in-pixel-plane distribution of charged migrating particles between the state wherein the charged migrating particles are statically adsorbed to the second electrode and the state wherein they are statically adsorbed to the first electrode, and therefore it is important for the purpose of increasing the contrast that the area of one of a pair of electrodes is as small as possible compared to the area of the other. However, increasing this ratio too much causes problems that charged migrating particles are not distributed uniformly over the electrode of the larger area or charged migrating particles overflow on the electrode of the smaller area, so that a ratio of 6:4 to 8:2 is appropriate.

On the other hand, in FIG. 12B, the first electrode 206 constitutes an electrode common to all the pixels. Therefore, it is necessary to divide the second electrode 208 provided through the insulating layer 211 on the first electrode 206 into portions for the respective pixels and to connect each portion to the switching circuit 203.

Figure 12C:
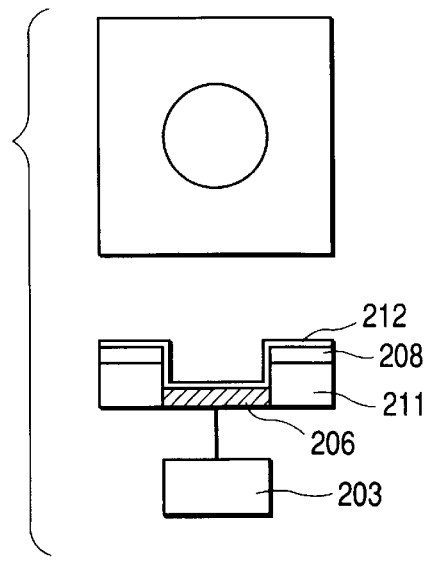
Figure 12D:
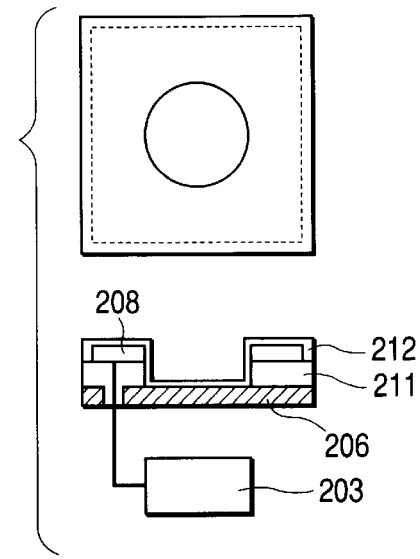

Furthermore, with regard to the shape of the pixel electrode, the pixel electrode can be shaped with a substantially smaller area of the first electrode 206 as shown in FIGS. 12C and 12D. In FIG. 12C, the first electrode 206 is divided into portions for the respective pixels, and each portion is connected to the switching circuit 203, and the second electrode 208 provided thereon through the insulating layer 211 serves as a common electrode. To the contrary, in FIG. 12D, the first electrode 206 constitutes a common electrode and the second electrode 208 provided thereon through the insulating layer 211 is divided into portions for the respective pixels, and each portion is connected to the switching circuit 203.

As the material of the insulating layer 211, there can be used those which are difficult to form pin holes when shaped in a thin film and have a low dielectric constant, such as amorphous fluororesin, highly transparent polyimide, PETP, acrylic resin, epoxy resin, or the like. Furthermore, the insulating layer is preferably colored in an appropriate color by mixing a pigment with the resin so as to function as a background color.

As the pigment, when the background color is white, alumina fine particles, titanium oxide fine particles, a white organic pigment for printing, or the like can be used. Of course, it is also possible to form a reflective layer (background color layer containing pigment) and the insulating layer in a stack structure. As the film thickness of the insulating layer 211, about 100 nm to about 1 $\mu$m is appropriate. Such an insulating layer 211 is applied to the first electrode 206 using the spin coating method or printing.

The shapes of the electrodes and insulating layer shown in FIGS. 12A to 12D are only for explanation purpose and their shapes are not limited to those depicted in the figures. For example, in FIGS. 12A and 12B, the shape of the second electrode 208 is depicted as one stripe, but can also be a plurality of stripes or can be a square figure surrounding the first electrode 206. Furthermore, in FIGS. 12C and 12D, the shape of the first electrode 206 is depicted as one circle as an example, but can also be a plurality of dots or a rectangle. Furthermore, the shape of the pixels is not limited to the shape depicted in the figures and can be hexagonal, for example.

With regard to the dimension of the pixels shown in FIGS. 12A to 12D, because the traveling distance of the charged particles increases as the pixel dimension increases, which causes an increase of the drive voltage and the switching time, the dimension needs to be relatively small. From this standpoint of view, the dimension of the pixels is preferably 10–200 $\mu$m square and more preferably 50–150 $\mu$m square. If a display device with a low resolution is required, a group of these fine pixels made by means of electrical wires may be treated as one pixel.

Returning to FIGS. 11A to 11G, the process of producing the display device will further be explained.

Second electrodes 208 are formed as common electrodes on the insulating layer 211 (FIG. 1E). Then, a connection 204 is provided if necessary. As described before, this second electrode may be divided into portions for the respective pixels depending on the configuration and connected to the switching circuits 203. In the case of the configuration shown in FIG. 12A and FIG. 12B, the second electrode may have any color, but is preferably colored in a color identical with or similar to the color of the charged migrating particles described later. In the case of the configuration shown in FIGS. 12C and 12D, if the insulating layer 211 is colored in the background color, the second electrode needs to be formed using a transparent material. Furthermore, the second electrode may also be formed of a non-transparent material and a layer of an appropriate background color may be formed thereon.

Then, the surface of the second electrode 208 is covered with a transparent surface protection layer 212. At this time, the insulating layer 211 may also be covered with the insulating layer 211 at the same time. As the material of the surface protection layer 212, for example, amorphous fluororesin, highly transparent polyimide, PETP, acrylic resin, epoxy resin, or the like can be used. The surface protection layer 212 preferably has a film thickness of about 100 nm to 1 $\mu$m.

Then, barriers 213 are formed. As a process of producing the barriers 213, a resist deposited in the form of a thick film may be patterned. The barriers 213 are provided to define a space to hold an electrophoretic liquid together with a surface protection plate that will be described later, and to prevent migration between the pixels of the charged particles. From the standpoint of the latter purpose, it is ideal to provide a barrier for each pixel, but barriers need not always be provided for respective pixels and may be provided for every several mm to several tens of mm. The height of the barriers 213 is dependent on the diameter of charged migrating particles used, but it is generally several $\mu$m to 100 $\mu$m and preferably 5–50 $\mu$m. It is also possible to form the barriers 213 before forming the aforementioned surface protection layer 212 and then form the surface protection layer 212 so as to cover the second electrode 208 and the barriers.

Figure 11A:
FIGS. 11A, 11B, 11C, 11D, 11E, 11F and 11G are schematic cross-sectional views showing an example of an in-plane type electrophoretic display element of the present invention using a drive circuit according to the present invention.
Figure 11B:
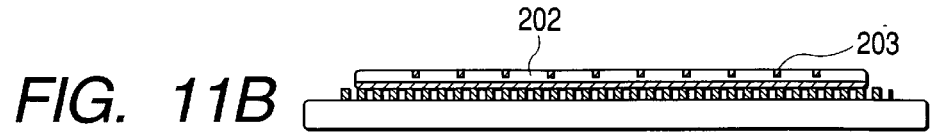
Figure 11C:
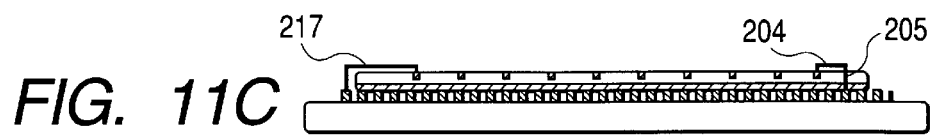
Figure 11D:
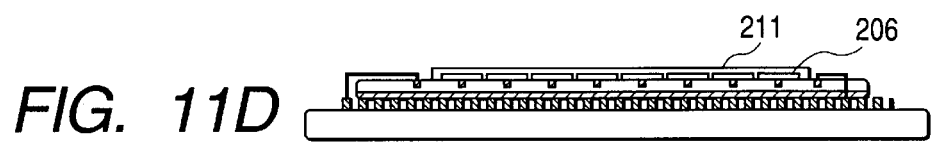
Figure 11E:
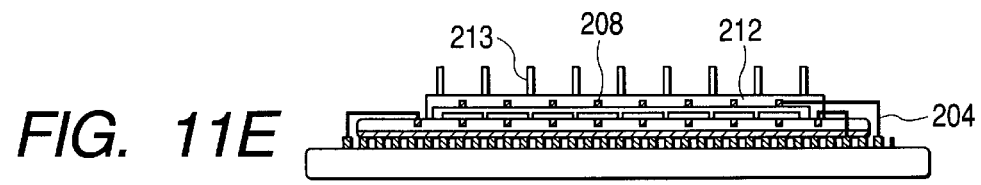
Figure 11F:
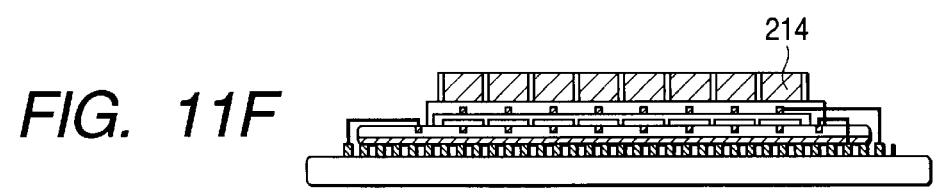

Then, an electrophoretic liquid 214 is injected (FIG. 11F). The electrophoretic liquid 214 consists of colored charged particles dispersed in a dispersion liquid and a material equivalent to that used for the aforementioned microcapsule type electrophoretic display cells can be used.

That is, as the charged particles, there can be used those which are capable of migrating in an electric field, made of a colored organic or inorganic material and have a fine particulate form. More specifically, there may be included not only ground carbon or pigment particles but also silica beads, styrene resin beads or acrylic resin beads mixed or covered with carbon or a pigment. There is no limitation to the diameter of the particles and those with about 0.01–50 $\mu$m in diameter can be normally used, but those with about 0.1–10 $\mu$m are preferably used.

As a dispersion liquid, an insulating liquid like oil such as a silicon oil, olive oil, aliphatic hydrocarbon such as isoparaffin, or aromatic hydrocarbon such as xylene and toluene or halogenated hydrocarbon is used.

Further, charge control agents to control or stabilize charging of charged migrating particles, for example, metallic complex salt of monoazoic dye, salicylic acid, organic quaternary ammonium salt, nigrosine compound, or the like are added in the dispersion liquid or in charged migrating particles as needed.

Furthermore, to prevent coagulation among charged migrating particles and keep a dispersion state, an additional dispersion agent may also be added into the dispersion liquid. As the dispersion agent, polyvalent metal phosphate such as calcium phosphate and magnesium phosphate, carbonate such as calcium carbonate, other inorganic salt, inorganic oxide, organic polymeric material, or the like can be used.

Furthermore, in order to match the specific gravity of charged migrating particles to that of the dispersion liquid, a specific gravity adjusting agent or the like can also be added. In the case of an in-plane type electrophoretic display, such a dispersion liquid need not be colored by a dye and may be transparent and colorless.

Finally, the display section is sealed using the surface protection plate 209 and a sealing member 210, which completes the in-plane type electrophoretic display device (FIG. 11G) There is no limitation to the material of the surface protection plate 209 and any material such as glass or plastics can be used as long as it is transparent.

In the above-described explanations, the circuit film 202 having switching circuits formed therein is bonded to the substrate 200 and the display section is successively constructed, but it is also possible to form the display section on the circuit film precedently and then separate the thus united member from the separation substrate and bond the member to the substrate to produce the display device.

Further, instead of forming the barriers 213 and injecting the electrophoretic liquid 214, it is also possible to charge and arrange the microcapsule type electrophoretic cells two-dimensionally as explained in the tenth embodiment. That is, the microcapsule type electrophoretic display cells can also be used for the in-plane type electrophoretic display.

Furthermore, with regard to the process of producing the display device comprising the circuit film having a peripheral circuit formed therein in addition to the circuit film having switching circuits formed therein, it can also be formed in the same way by forming the peripheral circuit section on the substrate of the display element beforehand or forming it simultaneously with the switching circuit sections of the image display element section.

Twelfth Embodiment

Next, a process of producing a display device by successively stacking a circuit film having a peripheral circuit formed therein, a circuit film having switching circuits formed therein and a display section will be explained with reference to FIGS. 13A to 13E taking an in-plane type electrophoretic display device as an example.

Figure 13A:
FIGS. 13A, 13B, 13C, 13D and 13E are a process chart showing an example of a process of producing a display element having a circuit film of the present invention.
Figure 13B:
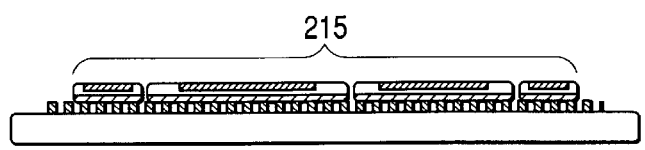
Figure 13C:
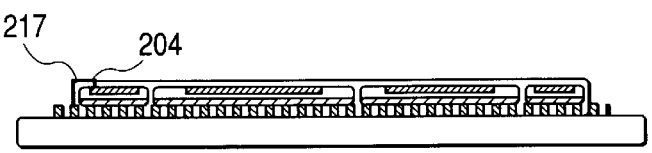

First, necessary wires 201 are formed on a substrate 200 (FIG. 13A). Then, circuit films 215 having a peripheral circuit formed therein are bonded thereto (FIG. 13B). Here, a plurality of members 215 including circuit films having a peripheral circuit formed therein are mounted, but these circuit films can also be integrated into a single member and mounted. Furthermore, prior to the bonding, a part or all of the wires 201 can be covered with an insulating film as needed. Then, a connection 204 is provided as needed (FIG. 13C).

Then, the surface of the circuit film having a peripheral circuit formed therein is covered with an insulating layer 216. This step may also be performed before peeling/separating the circuit film from the separation substrate.

Figure 13D:
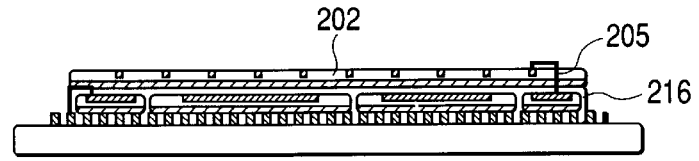

Then, a circuit film 202 having switching circuits formed therein is bonded using an adhesive. The circuit films having a peripheral circuit formed therein and the circuit film having switching circuits formed therein are connected to each other using contact holes 205 or the like appropriately (FIG. 13D). Here, the insulating layer 216 need not necessarily be formed, for example, when the circuit film 202 having switching circuits formed therein comprises an insulating layer.

Furthermore, the circuit film 202 having switching circuits formed therein may be divided into a plurality of portions and mounted as needed.

Furthermore, it is also preferable to form, in the circuit film having switching circuits formed therein, a driving circuit for driving the switching circuits and the peripheral circuit as one body from the standpoint of securing connections between both circuits.

Figure 13E:
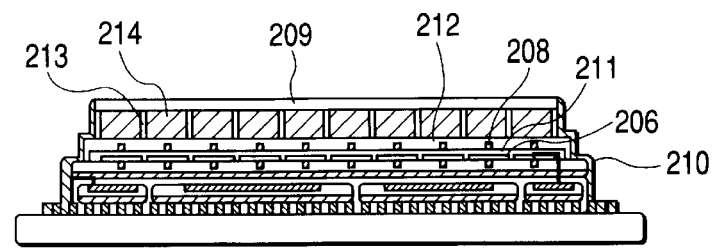

On top of this structure, an in-plane electrophoretic display section is constructed in the same way as in the foregoing embodiments (FIG. 13E).

Unlike the above-described order, it is also possible to form the display element section on the circuit film having the switching circuits formed beforehand therein and separate the thus united member from the separation substrate and bond the member to the member 215 comprising the circuit film having the peripheral section formed therein to produce the display device.

Here, the in-plane electrophoretic display section has been explained as the display section, but this embodiment is not limited to this display system.

As stated above, the separated circuit film 215 is bonded to the substrate 200, but it is also possible to bond the substrate or the substrate to which the circuit film has already been bonded to the unseparated circuit film first and then separate the circuit film. Furthermore, it is also possible to form the display section on the unseparated circuit film and then separate the circuit film and bond the circuit film to the substrate or the substrate to which the circuit film has already been bonded.

Furthermore, with regard to the configuration of the display element, it is also possible to successively stack the switching circuit sections and the display section on one surface of the substrate and form the circuit film having a peripheral circuit formed therein on the other surface of the substrate.

The circuit film having a peripheral circuit section is formed on the second surface (back surface) of the substrate of the display element beforehand. Then, the circuit film having switching circuit sections is formed on the first surface (front surface) and the display element is formed according to the aforementioned process, and in this way this embodiment can be easily implemented.

Figure 14:
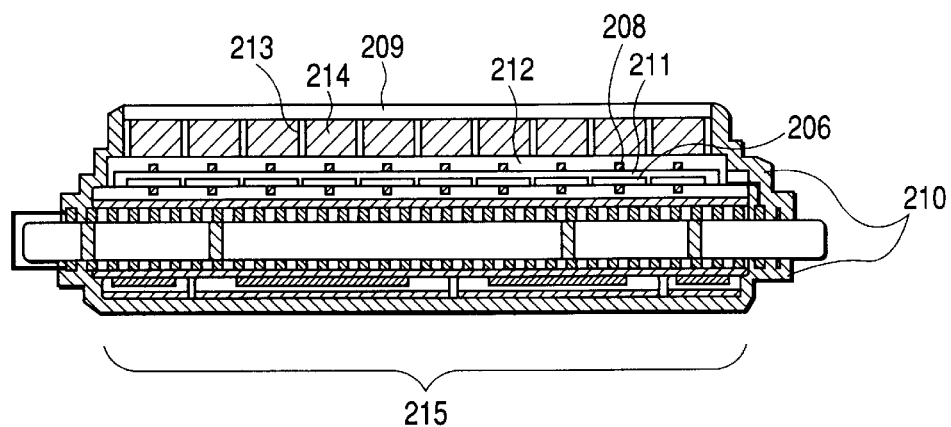
FIG. 14 is a schematic view illustrating another configuration example of a display element having a circuit film of the present invention.

To the contrary, it is also possible to form the element on the surface of the first substrate precedently, but forming the peripheral circuit sections precedently will reduce a damage that the display element section may receive during formation of the peripheral circuit section, and therefore it is preferable to form the peripheral circuit section on the back surface precedently. The final configuration is shown in FIG. 14.

Furthermore, in the step of forming a circuit film having the peripheral circuit section on the back surface of the substrate of the display element, it is also possible to form the film through a third substrate.

As the third substrate, a rigid substrate such as a glass substrate or glass epoxy substrate or a resin film can be used. As in the case of the aforementioned step, a peripheral circuit section is formed on the third substrate, the circuit film 215 including it is bonded to the third substrate through an adhesive. The substrate is as such bonded to the back surface of the display element substrate through an adhesive to form the display element.

Furthermore, electrical connection between the electric wire on the third substrate and the wire on the display element substrate may also be made directly through wire bonding, or the like. Furthermore, when the third substrate is a flexible film, a variety of mounting processes are available in addition to bonding it to the back surface, such as bending the film at the lead-out wiring section or the like.

EXAMPLES

Example 1

In this example, the display device of the configuration shown in FIGS. 3A and 3B was produced. The production steps mostly conform to the those illustrated in the figures and therefore this example will be explained with reference to FIGS. 11A to 11G.

On a substrate 200 made of a polyethylene terephthalate (PETP) film, aluminum was patterned to form necessary wires 201 (FIG. 11A), and then a circuit film 202 having switching circuit sections 203 formed therein was bonded thereto in the face up direction using a thermosetting adhesive (FIG. 11B). Then, aluminum metallization 217 was applied to perform desired conduction with the wires 201 (FIG. 11C).

Hereunder, the process of producing the circuit film 202 having the switching circuit sections formed therein will be explained. The production steps mostly conform to those shown in FIGS. 6A to 6D and FIGS. 7A and 7B, and therefore the steps will be explained with reference to the figures.

A p-type monocrystalline silicon substrate 100 of 300 mm in diameter and a specific resistance of 0.01 Ω.cm was anodized in an HF solution to form a separation layer 101 comprising a porous silicon layer (FIG. 6A). The anodization conditions were as follows:

Current density: 7 mA.cm$^{-2}$; Anodization solution: HF:H$_2$O:C$_2$H$_5$OH=1:1:1; Anodization time: 11 minutes; Thickness of porous silicon: 12 μm The porosity of the porous silicon layer was adjusted to 20% so that a high quality epitaxial silicon layer could be formed on the porous silicon layer and could be used as a separation layer.

This monocrystalline silicon substrate was oxidized in an oxygen atmosphere at 400° C. for one hour. This oxidization caused the inner walls of the pores of the porous silicon to be covered with a thermally oxidized film. The surface of the porous silicon layer was treated with hydrofluoric acid such that only the oxide film in the surface of the porous silicon layer was removed while the oxide film in the inner wall surfaces of the pores was left. Then, monocrystalline silicon was allowed to epitaxially grow on the porous silicon layer to a thickness of 0.15 μm according to a CVD method to form a semiconductor film 102 (FIG. 6B).

The growth conditions were as follows:

Source gas: SiH$_2$Cl$_2$/H$_2$; Gas flow rates: 0.5/180 l/min; Gas pressure: 80 Torr; Temperature: 950° C.; Growth rate: 0.3 μm/min Prior to the epitaxial growth, heat treatment was conducted in an atmosphere containing hydrogen. This was intended to seal the surface pores. In addition to this heat treatment, it is also possible to add micro silicon atoms by means of a raw material gas or the like to complement the sealing of the surface pores.

The substrate formed here can be treated as a wafer of the same quality as that of a normally used epitaxial wafer except that the porous layer is formed below the epitaxially grown silicon layer.

An active matrix switching circuit section 103 was formed in a central area of 280 mm (11 inches) in diagonal length of the wafer of the semiconductor film 102 comprising this epitaxially grown silicon layer (FIG. 6C). The switching circuit sections include conventionally known MOSFETs and capacitors.

Then, the circuit film 202 including these switching circuit sections was bonded through an adhesive layer to a glass plate which was a support substrate 107 (FIG. 7A).

Then, the separation was effected at the porous silicon layer functioning as a separation layer 101 (FIG. 7B). Water jet was used for the separation. After removing the separation film remaining on the circuit film, an adhesive was applied to the separation layer side with the support substrate 107 bonded thereto and bonded to a predetermined position of the substrate 200. Then, the support substrate 107 and the adhesive layer 108 were removed. In this way, the circuit film 202 was disposed in face up direction on the substrate.

Furthermore, a process of producing the display device will be explained.

A circuit film provided with a peripheral circuit having a scanning line drive circuit and data line drive circuit formed therein was produced using the same process as that for the above-described circuit film 202 and was bonded to a predetermined position on the substrate 200.

Then, it was subjected to desired conduction with the wires on the substrate through metallization 217.

These circuit films 202 used were the ones divided into chips and the process of producing them will be explained with reference to FIGS. 8A to 8C. The procedure of the steps up to the step of forming a peripheral circuit is substantially the same as the aforementioned process of forming the circuit film having switching circuits formed therein.

After bonding a dicing film (not shown) to the surface of the circuit film, dicing was effected thereto to form the cut grooves 110 (FIG. 8B). The depth of the cut grooves reached the porous silicon layer, which was the separation layer 109. Water jet was blown against the cut grooves 110 and separation layer 109 and a circuit film 105 divided into chips was obtained (FIG. 8C).

Then, a display section of the in-plane type electrophoretic display was formed on the circuit film 202 having the switching circuit formed therein. Each pixel had a shape as shown in FIG. 12C. The size of each pixel was 125 $\mu$m×125 $\mu$m and the apparent percentage of the area occupied by the first display electrode in a pixel when viewed from the observer was set to be 20%.

First, the circuit film having the switching circuits formed therein was covered with an acrylic resin to be flattened and then contact holes were formed so that the drain and the first electrode could be connected to each other. Then, a titanium film covered with a black resist was formed as a first electrode 206 and then patterned so as to be divided into portions corresponding to respective pixels.

Then, an insulating layer 211 made of an acrylic resin having white titanium oxide fine particles dispersed therein was formed on the entire surface in a thickness of 10 $\mu$m (FIG. 1D). Then, an ITO film was formed at a low temperature as a second display electrode 208 using the magnetron sputtering method and patterned in a recessed shape through photolithography and reactive dry etching using $CF_4$ and $O_2$ gases in such a way that the first electrode was exposed by 20% in area with regard to the pixel.

Then, a thick-film resist (trade name: THB, manufactured by JSR Corporation) was applied in a thickness of 20 $\mu$m and then the resist film was exposed and developed to form a barrier 213 of 20 $\mu$m in height. The barrier was formed to have a thickness of 10 $\mu$m and a pitch of 1.25 mm.

Then, a surface protection layer 212 made of amorphous fluororesin was formed over the entire surface including the surface of the barrier in a thickness of 200 nm (FIG. 1E).

Then, the spaces enclosed by the formed barrier were filled with an electrophoretic liquid 214 consisting of black charged particles and insulating dispersion liquid (FIG. 11F). As the black charged particles, polystyrene-polymethyl methacrylate copolymer resin containing carbon black of about 1–2 $\mu$m in particle diameter was used. For the dispersion liquid, isoparaffin (trade name: ISOPAR, manufactured by Exon Corporation) was used, and succinic imide (trade name: OLOA1200, manufactured by Chevron Corporation) was further added as a charge control agent.

Figure 11G:
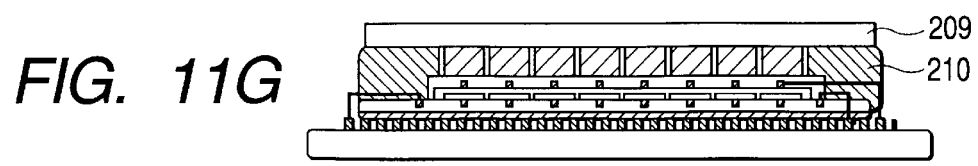

Then, a thermally fusible adhesive layer pattern was formed on a polycarbonate surface protection plate 209 of 100 $\mu$m in thickness and the surface protection plate 209 was placed on the barrier 213 while effecting alignment and bonded under heating. Finally, a sealing 210 was applied to necessary parts using an epoxy resin adhesive to complete a sheet-like display device (FIG. 11G). The configuration of the completed display device was almost the same as that shown in FIGS. 3A and 3B.

A power supply, controller, D/A converter, and so on were connected to the completed display device and a matrix image display was carried out, with the result that an image could be displayed even if the display device was in bent state. On the other hand, the remaining semiconductor substrate after the separation was recyclable and the layer on which a circuit and/or an integrated circuit were to be formed was a layer which was newly epitaxially grown every time in repeated use, and therefore no deterioration of the circuit characteristic or deterioration of the display characteristic of the display device by repetition was observed.

Example 2

A display was produced following the same procedure as in Example 1 with the exception that a microcapsule type electrophoretic display was used instead of the in-plane type electrophoretic display as the display section.

A step of forming a microcapsule type electrophoretic display on the circuit film 202 having the switching circuit sections formed therein will be explained with reference to FIGS. 10A to 10G.

First, an aluminum film of 200 nm in thickness was formed as first electrodes 206 on the circuit film having the switching circuit sections formed therein and then patterned so that it was divided into portions in a one-to-one correspondence with pixels (FIG. 10D).

Then, microcapsule type electrophoretic display cells 207 containing charged particles and dispersion liquid were produced using a dispersion polymerization method. For the charged particles, titanium oxide fine particles were used. The average diameter of the particles was approximately 1.5 $\mu$m. For the dispersion liquid, isoparaffin (product name: ISOPER, manufactured by Exon Corporation) having a blue pigment dissolved therein was used. As the capsule wall material, gelatin was used. The average diameter of the microcapsules produced was approximately 50 $\mu$m.

Then, the microcapsule type electrophoretic display cells 207 produced were mixed with a silicone resin and a crosslinking agent therefor and applied uniformly to the plane including the first electrodes 206 in such a way that the microcapsule type electrophoretic display cells 207 would form a mono-particle layer (FIG. 10E).

Then, an ITO film was formed as a second electrode 208 at a low temperature on a surface protection plate 209 comprised of a PETP film using the magnetron sputtering method and disposed on the microcapsule type electrophoretic display cells 207 (FIG. 10F) and finally sealing 210 was applied to necessary parts using an epoxy resin adhesive to complete a sheet-like display device (FIG. 10G).

A power supply, controller, D/A converter, and so on were connected to the completed display device and a matrix image display was effected, with the result that an image could be displayed even if the display device was in bent form because the display substrate was a plastic film.

Example 3

In Example 1, the porous layer used as the separation layer was a single layer, but this example used two porous layers of different porosities.

First, anodization of the surface of the monocrystalline silicon substrate was performed under the following conditions:

Current density: 8 mA.cm$^{-2}$; Anodization solution: HF:H$_2$O:C$_2$H$_5$OH=1:1:1; Anodization time: 5 minutes; Thickness of porous silicon: 6 $\mu$m.

Then, anodization was further performed under the following conditions:

Current density: 33 mA.cm$^{-2}$; Anodization solution: HF:H$_2$O:C$_2$H$_5$OH=1:1:1; Anodization time: 80 seconds; Thickness of porous silicon: 3 $\mu$m Thus, a porous layer with a high porosity of 45% was formed on the monocrystalline silicon substrate side and further a porous layer with a low porosity of 20% was formed thereon. Then, the display device was produced following the same procedure as that of Example 1.

Incidentally, the thicknesses of the two porous layers can be varied by changing the anodization conditions.

The anodization liquid does not necessarily have the above-described composition. Furthermore, instead of ethanol, other alcohols such as isopropyl alcohol can also be used. Since the alcohol is intended to prevent attachment of reaction bubbles to the surface of the wafer as a surface active agent, other surface active agents than alcohols may also be used or attachment of bubbles to the surface may also be removed by ultrasonic waves instead of adding the surface active agent.

A power supply, controller, D/A converter, and so on were connected to the completed display device and a matrix image display was effected, with the result that an image could be displayed even if the display device was in bent form as in the case of the aforementioned examples.

Example 4

This example is an example where a separation layer is formed using an ion implanted layer.

First, a p-type monocrystalline silicon substrate of a specific resistance of 14 Ω.cm was prepared. The plane orientation was <100>. MOSFETs and capacitors were formed on the surface of this monocrystalline silicon substrate as switching circuits.

Then, hydrogen ions were implanted in a predetermined depth (depth of 10 μm from the surface side in this example) from the side for formation of the element and circuits to form an ion implanted layer. The amount of ion implantation was $10^{15}$ to $10^{17}/cm^2$. A protection film was formed on the outermost surface prior to the implantation.

On this substrate, a monocrystalline silicon film was epitaxially grown and a switching circuit section was formed therein to form a circuit film.

Then, water as a fluid was sprayed against the side surface of the ion implanted layer to separate the circuit film. This separation could also be realized by effecting heat treatment at 400–600° C.

Example 5

In this example, a display device of the configuration shown in FIG. 5B was produced.

The production steps mostly conform to those shown in FIGS. 13A to 13E and therefore this example will be explained with reference to FIGS. 13A to 13E.

On a substrate 200 made of a polyethylene terephthalate (PETP) film, a pattern of aluminum was formed to provide necessary wires 201 (FIG. 13A). Then, a circuit film 215 having a peripheral circuit section formed therein was produced following the same procedure as that of the circuit film explained in Example 3 and bonded to a predetermined position on the substrate 200 (FIG. 13B).

The circuits and integrated circuits formed on the circuit film includes a booster circuit, D/A conversion circuit, clock circuit, CPU circuit, wireless reception circuit and memory.

Then, connections between the circuits and between each circuit and wiring were made using metallization 217 (FIG. 13C). Then, the entire surface of the circuit was covered with an acrylic resin to form an insulating layer 216. This insulating layer 216 also serves as a flattening layer.

Then, the circuit film 202 having switching circuits formed therein was produced following the same procedure as that for the circuit film explained in Example 3 and bonded to the insulating layer 216 (FIG. 13D).

Finally, connections with the circuit film provided with the peripheral circuit including the scanning line drive circuit and data line drive circuit were made by formation of the contact hole 205 or the like appropriately. On top of it, an in-plane type electrophoretic display section was formed in the same manner as in Example 1 to complete the display device (FIG. 13E).

A sheet-like lithium ion cell as a power supply was bonded to the back surface of the substrate 200 of the completed display element. When a display operation was performed, it was proven that an image could be displayed even if the display device was in bent form.

Example 6

A display device was produced following the same procedure as in Example 2 with the exception that an organic FET using poly(3-hexylthiophene) as an organic semiconductor was used for the switching circuits instead of using the circuit film formed of a monocrystalline silicon film. For the gate insulating film, an $Si_3N_4$ film of 180 nm in thickness was used.

Thus, a display device having almost the same shape as that shown in FIGS. 3A and 3B was formed.

A power supply, controller, D/A converter, and so on were connected to the completed display device and a matrix image display was effected, with the result that an image could be displayed even if the display device was in bent form.

Example 7

A display device was produced following the same procedure as in Example 2 with the exception that MIM structure elements were formed for the switching circuit sections instead of MOSFET. After oxidizing the semiconductor film 102 the MIM structure used was obtained by evaporating thallium onto chromium electrode, anodizing the thallium and further evaporating thallium and chromium.

A power supply, controller, D/A converter, and so on were connected to the completed display device and a matrix image display was effected, with the result that an image could be displayed even if the display device was in bent form.

Example 8

A display device was produced following the same procedure as in Example 2 with the exception that the substrate 200 was a polyimide substrate on both sides of which silicon nitride was deposited in a thickness of 500 nm and that amorphous silicon TFT structure elements were used for the switching circuits. The amorphous silicon TFT and pixel capacitor for charge storage were formed using a conventionally known technique.

A power supply, controller, D/A converter, and so on were connected to the completed display device and a matrix image display was effected, with the result that an image could be displayed even if the display device was in bent form.

Example 9

Electrical connections between the circuit film and the wire formed on the substrate will be explained with reference to FIG. 15.

When, for example, a circuit film 402 disposed with an adhesive on a substrate 1 is disposed in face up state, the state of connections between wires 201 formed on the substrate 100 and a wiring section in the circuit film are shown in FIG. 15.

In general, connections using a wire bonding method are simple and frequently used. However, when connection density is high and distance between wires is small, the wire bonding method is not appropriate. Further, in the case of face-down bonding, when the bump section formed on the substrate and the terminal section of the circuit film are to be aligned for connections, both terminal sections get out of sight and therefore use of face-down bonding is difficult. The use of face-down bonding is especially difficult when the wiring pitch is small and the wire width is small.

Thus, it is effective to connect the circuit film 202 in face up state to the substrate. This makes it easier to check the connection positions and drastically reduces the difficulty involved in the above-described alignment.

At this time, if the circuit film is sufficiently thin, it is possible to provide sufficient step coverage of the adhesive layer and circuit film without excessively increasing the film thickness of the wires 201. Furthermore, in the case of metallization, even if the above-described wiring density is high, mask vapor deposition allows easy arrangement of a connecting metal.

Thus, face-up connections through the metallization 217 shown in FIG. 15 are effective. Furthermore, this metallization 217 can also be used for connections between the circuit sections in the circuit film.

In the above-described examples, the display device was constructed using an in-plane type electrophoretic display or microcapsule type electrophoretic display for the display section, but the present invention is also applicable to any other display systems as long as they allow display based on the electrical address system. For example, the present invention is applicable to liquid crystal display, EL display, normal electrophoretic display, twisting ball display, or the like.

Effects of the Invention

As stated above, the present invention makes it possible to mount a high performance drive circuit having switching circuits and/or peripheral circuits on all kinds of substrates including plastics and provide a thin, high performance display device. Furthermore, the use of a film substrate can easily provide a flexible, sheet-shape display device.

What is claimed is:

1. A display device comprising an image display element section and at least one of a switching circuit section wherein the at least one of switching circuit section and peripheral circuit section is formed by performing one or more times a forming step of forming a circuit section comprising the at least one of switching circuit section and peripheral circuit section in a circuit film disposed on a second substrate and a transferring step of transferring and disposing the circuit film having the circuit section formed therein on the first substrate.

2. The display device according to claim 1, wherein the transferring step comprises a bonding step of bonding the circuit film to the first substrate and a separating step of separating the circuit film from the second substrate.

3. The display device according to claim 1, wherein the circuit film is transferred to and disposed on the first substrate through at least one third substrate.

4. The display device according to claim 1, wherein at least one of the first and the third substrates is a plastic film substrate.

5. The display device according to claim 1, wherein the material constituting the at least one of switching circuit section and peripheral circuit section comprises an organic semiconductor, amorphous silicon, polycrystalline silicon or monocrystalline silicon.

6. The display device according to claim 1, wherein the circuit film comprises a semiconductor element, a semiconductor integrated circuit, or an element of a metal/insulator/metal stack structure (MIM structure).

7. The display device according to claim 6, wherein the circuit film comprises at least one of a semiconductor element and a semiconductor integrated circuit formed in a monocrystalline silicon layer.

8. The display device according to claim 6, wherein the circuit film is comprised of a material having flexibility.

9. The display device according to claim 1, wherein the circuit film is at least a part of at least one of a semiconductor film and an insulating film formed on a separation layer formed on the second substrate.

10. The display device according to claim 9, wherein the separation layer is a porous layer or ion implanted layer.

11. The display device according to claim 1, which has a configuration such that the switching circuit section is disposed on a first surface of the first substrate and at least a part of the peripheral circuit section is disposed on a second surface of the first substrate.

12. The display device according to claim 1, which has a configuration such that at least one layer of the circuit film having at least a part of the peripheral circuit section formed therein is formed on the first substrate and the switching circuit section and the image display element section are successively formed thereon.

13. The display element according to claim 1, wherein electrical connection with the at least one of peripheral circuit section and switching circuit section contained in the circuit film is made through metallization.

14. A process of producing the display device as set forth in claim 1, comprising the following steps (1), (2), (3), (4) and (5):

(1) a step of preparing a second substrate comprising a separation layer and a semiconductor film successively stacked on a substrate;

(2) a forming step of forming at least one of switching circuit section and peripheral circuit section in the semiconductor film to form a circuit film;

(3) a separating step of separating the circuit film from the second substrate;

(4) a transferring step of transferring and disposing the circuit film onto the first substrate; and (5) a step of forming an image display element section on the circuit film, provided that each said step is performed at least once.

15. The process according to claim 14, wherein the circuit film is transferred to and disposed on the first substrate through at least one third substrate.

16. The process according to claim 14, wherein in the transferring step, at least a part of the circuit film is stacked and disposed.

17. The process according to claim 14, wherein the second substrate is a semiconductor substrate, and wherein the formation of the circuit film comprises a step of forming a separation layer on the surface of the semiconductor, a step of forming a semiconductor film on the separation layer, and a step of forming the circuit section comprising at least one of a semiconductor element and a semiconductor integrated circuit in the semiconductor film.

18. The process according to claim 17, wherein the separation layer is a porous silicon layer.

19. The process according to claim 17, wherein the semiconductor film comprises at least one of monocrystalline silicon and a chemical compound semiconductor.

20. The process according to claim 14, wherein a cut groove is formed in a predetermined area on at least one of the second substrate having the circuit film formed therein and the circuit film, the circuit film is then bonded to the first substrate, the circuit film is separated from the second substrate, and the circuit film in the predetermined area is selectively transferred to and disposed on the first substrate.

21. The process according to claim 14, wherein prior to the separating step, a uniting step of bonding a support substrate onto the circuit film to unite the circuit film and the support substrate is performed, and in the separating step, the circuit film united with the support substrate is peeled and separated with the separation film being a boundary.

22. The process according to claim 14, wherein the circuit film is cut prior to the transferring step and at least one of the circuit film divided into chips is transferred to and disposed on the first substrate.

23. The process according to claim 15, wherein the circuit film is cut prior to the transferring step and in the transferring step, at least one of the circuit film divided into chips is transferred to and disposed on a third substrate and then the third substrate having the at least one chip-shape circuit film is disposed on the first substrate.

24. The process according to claim 14, wherein the image display element section is formed on the circuit film formed on the second substrate having the separation layer and then the circuit film is separated from the separation layer.

25. A process of producing the display device according to claim 14, wherein the circuit film is disposed in a face up direction on the first substrate and electrical connection is made through metallization.

26. A display device comprising:
an image display element section on a substrate;
a switching circuit section for driving the image display element section; and
a peripheral circuit section for driving the switching circuit section, each of the switching circuit section and the peripheral circuit section comprised of a circuit film,
wherein the switching circuit section and the image display section are stacked on the substrate and the peripheral circuit section is connected to the switching section by metallization.

27. The display device according to claim 26, wherein the circuit film is thin enough to form a metal film directly on the circuit film without wire breakage at a step portion of the circuit film.

28. The display device according to claim 26, wherein the circuit film is disposed on the substrate in a face up direction.

29. The display device according to claim 26, wherein the switching circuit section and the image display section are stacked on the peripheral circuit section.

30. The display device according to claim 26, wherein the peripheral circuit section is disposed on a same plane as that of the switching circuit section.

31. A display device comprising:
an image display element section on a substrate;
a switching circuit section for driving the image display element section; and
a peripheral circuit section for driving the switching circuit section, each of the switching circuit section and the peripheral circuit section comprised of a circuit film,
wherein the switching circuit section and the image display section are stacked on the substrate and the peripheral circuit section is connected to the switching section by a flexible wire.

32. The display device according to claim 31, wherein the peripheral circuit section is disposed on the back surface of the substrate.

33. The display device according to claim 31, wherein the peripheral circuit section is disposed on a film substrate and disposed on the back surface of the substrate.

34. A display device comprising:
an image display element section on a substrate;
a switching circuit section for driving the image display element section; and
a peripheral circuit section for driving the switching circuit section, each of the switching circuit section and the peripheral circuit section being comprised of a circuit film,
wherein wires are formed on the substrate and the circuit film is bonded on the substrate and connected to the wires through connecting means.

35. The display device according to claim 34, wherein the connecting means is a bump or an ACF film.

36. The display device according to claim 34, wherein the circuit film is supported by a supporting substrate.

* * * * *

UNITED STATES PATENT AND TRADEMARK OFFICE
CERTIFICATE OF CORRECTION

PATENT NO.    : 6,800,871 B2
DATED         : October 5, 2004
INVENTOR(S)   : Hiroshi Matsuda et al.

It is certified that error appears in the above-identified patent and that said Letters Patent is hereby corrected as shown below:

Column 14,
Line 35, "pattering" should read -- patterning --.

Column 17,
Line 56, "(FIG. 11G)" should read -- (FIG. 11G). --.

Column 25,
Line 49, "section" (second occurrence) should read -- and a peripheral circuit section for driving the image display element section disposed on a first substrate, --.

Signed and Sealed this

Twenty-fifth Day of January, 2005

JON W. DUDAS
*Director of the United States Patent and Trademark Office*

UNITED STATES PATENT AND TRADEMARK OFFICE
CERTIFICATE OF CORRECTION

PATENT NO. : 6,800,871 B2
DATED : October 5, 2004
INVENTOR(S) : Hiroshi Matsuda et al.

It is certified that error appears in the above-identified patent and that said Letters Patent is hereby corrected as shown below:

<u>Title page,</u>
Item [30], Foreign Application Priority Data,
 "Dec. 17, 2002 (JP) ................................. 2002-385031" should read
 -- Dec. 17, 2002 (JP) ................................. 2002-365031 --.

Signed and Sealed this

Tenth Day of May, 2005

JON W. DUDAS
*Director of the United States Patent and Trademark Office*